(12) United States Patent
Pagani et al.

(10) Patent No.: US 9,202,951 B2
(45) Date of Patent: *Dec. 1, 2015

(54) INTEGRATED OPTOELECTRONIC DEVICE AND SYSTEM WITH WAVEGUIDE AND MANUFACTURING PROCESS THEREOF

(71) Applicant: STMicroelectronics S.r.l, Agrate Brianza (IT)

(72) Inventors: Alberto Pagani, Nova Milanese (IT); Alessandro Motta, Cassano d'Adda (IT); Sara Loi, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 13/933,858

(22) Filed: Jul. 2, 2013

(65) Prior Publication Data

US 2014/0001493 A1    Jan. 2, 2014

(30) Foreign Application Priority Data

Jul. 2, 2012    (IT) .............................. TO2012A0583

(51) Int. Cl.
*H01L 31/12*    (2006.01)
*H01L 31/0232*    (2014.01)
(Continued)

(52) U.S. Cl.
CPC ...... *H01L 31/02327* (2013.01); *G02B 6/12002* (2013.01); *G02B 6/12004* (2013.01); *G02B 6/43* (2013.01); *H01L 31/103* (2013.01); *H01L 31/125* (2013.01)

(58) Field of Classification Search
CPC ............ H01L 31/02327; H01L 31/125; H01L 31/103; G02B 6/43; G02B 6/12002; G02B 6/12004; G02B 6/42; G02B 6/4214

USPC ........ 257/84, E25.013, 777, 432, 686, 80, 98; 438/24, 29, 31, 69; 385/14, 15, 31
See application file for complete search history.

(56) References Cited

U.S. PATENT DOCUMENTS 5,191,394 A    3/1993    Saia et al.
5,652,811 A    7/1997    Cook et al.
(Continued)

FOREIGN PATENT DOCUMENTS

EP    1 567 900 A2    8/2005

OTHER PUBLICATIONS

Markus B. Schenkel et al., "Joint Decoding of Stereo JPEG Image Pairs," Sep. 26, 2010, 4 pages, International Conference on Image Processing (ICIP 2010), USA.

(Continued)

*Primary Examiner* — William F Kraig
*Assistant Examiner* — Pavel Ivanov
(74) *Attorney, Agent, or Firm* — Seed IP Law Group PLLC

(57) ABSTRACT

An integrated electronic device, delimited by a first surface and by a second surface and including: a body made of semiconductor material, formed inside which is at least one optoelectronic component chosen between a detector and an emitter; and an optical path which is at least in part of a guided type and extends between the first surface and the second surface, the optical path traversing the body. The optoelectronic component is optically coupled, through the optical path, to a first portion of free space and a second portion of free space, which are arranged, respectively, above and underneath the first and second surfaces.

28 Claims, 25 Drawing Sheets

(51) Int. Cl.
*G02B 6/43* (2006.01)
*G02B 6/12* (2006.01)
*H01L 31/103* (2006.01)

(56) References Cited

U.S. PATENT DOCUMENTS

| | | | |
|---|---|---|---|
| 6,090,636 | A | 7/2000 | Geusic et al. |
| 6,300,218 | B1 | 10/2001 | Cohen et al. |
| 6,353,264 | B1 * | 3/2002 | Coronel et al. ............... 257/777 |
| 6,650,823 | B1 | 11/2003 | Murali |
| 6,661,035 | B2 | 12/2003 | Negro et al. |
| 6,723,577 | B1 | 4/2004 | Geusic et al. |
| 6,815,828 | B1 * | 11/2004 | Coronel et al. ............... 257/777 |
| 6,924,510 | B2 | 8/2005 | Gardner et al. |
| 6,936,868 | B2 | 8/2005 | Hiraoka et al. |
| 7,166,521 | B2 | 1/2007 | Boyd et al. |
| 7,352,066 | B2 | 4/2008 | Budd et al. |
| 7,829,904 | B2 | 11/2010 | Coffa et al. |
| 8,005,326 | B2 | 8/2011 | Chang et al. |
| 2005/0101054 | A1 | 5/2005 | Mastromatteo et al. |
| 2011/0246545 | A1 | 10/2011 | Morimoto |
| 2011/0279654 | A1 | 11/2011 | Ueda et al. |
| 2012/0104478 | A1 * | 5/2012 | Masuoka et al. ............... 257/292 |

OTHER PUBLICATIONS

Cloutier et al., "Optical gain and stimulated emission in periodic nanopatterned crystalline silicon," *Nature Materials* 4;887-891, Dec. 2005.

Corte et al., "Electro-optical modulation at 1550 nm in an as-deposited hydrogenated amorphous silicon p-i-n waveguiding device," *Optics Express* 19(4):2941-2951, Feb. 14, 2011.

Daldosso et al., "Er-Coupled Si Nanocluster Waveguide," *IEEE Journal of Selected Topics in Quantum Electronics* 12(6):1607-1617, Nov. 2006.

Green et al., "Efficient silicon light-emitting diodes," *Nature* 412:805-808, Aug. 23, 2001.

Liao et al., "High speed silicon Mach-Zehnder modulator," *Optics Express* 13(8):3129-3135, Apr. 18, 2005.

Liu et al., "Tensile-strained, n-type Ge as a gain medium for monolithic laser integration on Si," *Optics Express* 15(18):11272-11277, Sep. 3, 2007.

Marris-Morini et al., "Low loss optical modulator in a silicon waveguide based on a carrier depletion horizontal structure," IEEE International Conference on Group IV Photonics, Sep. 19-21, 2007, Tokyo, 3 pages.

Muscarà et al., "Design and Electro-Optical Characterization of Si-Based Resonant Cavity Light Emitting Devices," *IEEE Journal of Quantum Electronics* 47(10):1362-1368, Oct. 2011.

Ng et al., "An efficient room-temperature silicon-based light-emitting diode," *Nature* 410;192-195, Mar. 8, 2001.

Parekh et al., "Electrical, Optical and Fluidic Through-Silicon Vias for Silicon Interposer Applications," IEEE $61^{st}$ Electronic Components and Technology Conference, May 31-Jun. 3, 2011, Lake Buena Vista, FL, 1992-1998.

Pavesi et al., "Optical gain in silicon nanocrystals," *Nature* 408:440-444, Nov. 23, 2000.

Pinguet et al., "A 1550 nm, 10 Gbps optical modulator with integrated driver in 130 nm CMOS," $4^{th}$ IEEE International Conference on Group IV Photonics, Sep. 19-21, 2007, Tokyo, 3 pages.

Prather et al., "Novel Fabrication Methods for 2D Photonic Crystals in Silicon Slab Waveguides," *Proc. Spie* 4984:89-99, 2003.

Rong et al., "A continuous-wave Raman silicon laser," *Nature* 433:725-728, Feb. 17, 2005.

Samara-Rubio et al., "A gigahertz silicon-on-insulator Mach-Zehnder modulator," *Optical Fiber Communication Conference*, Feb. 23-27, 2004, Los Angeles, CA, 3 pages.

Selvaraja et al., "Low-Loss Amorphous Silicon-On-Insulator Technology for Photonic Integrated Circuitry," *Optics Communications* 282(9):1767-1770, May 2009.

Walters et al., "Field-effect electroluminescence in silicon nanocrystals," *Nature Materials* 4:143-146, 2005.

\* cited by examiner

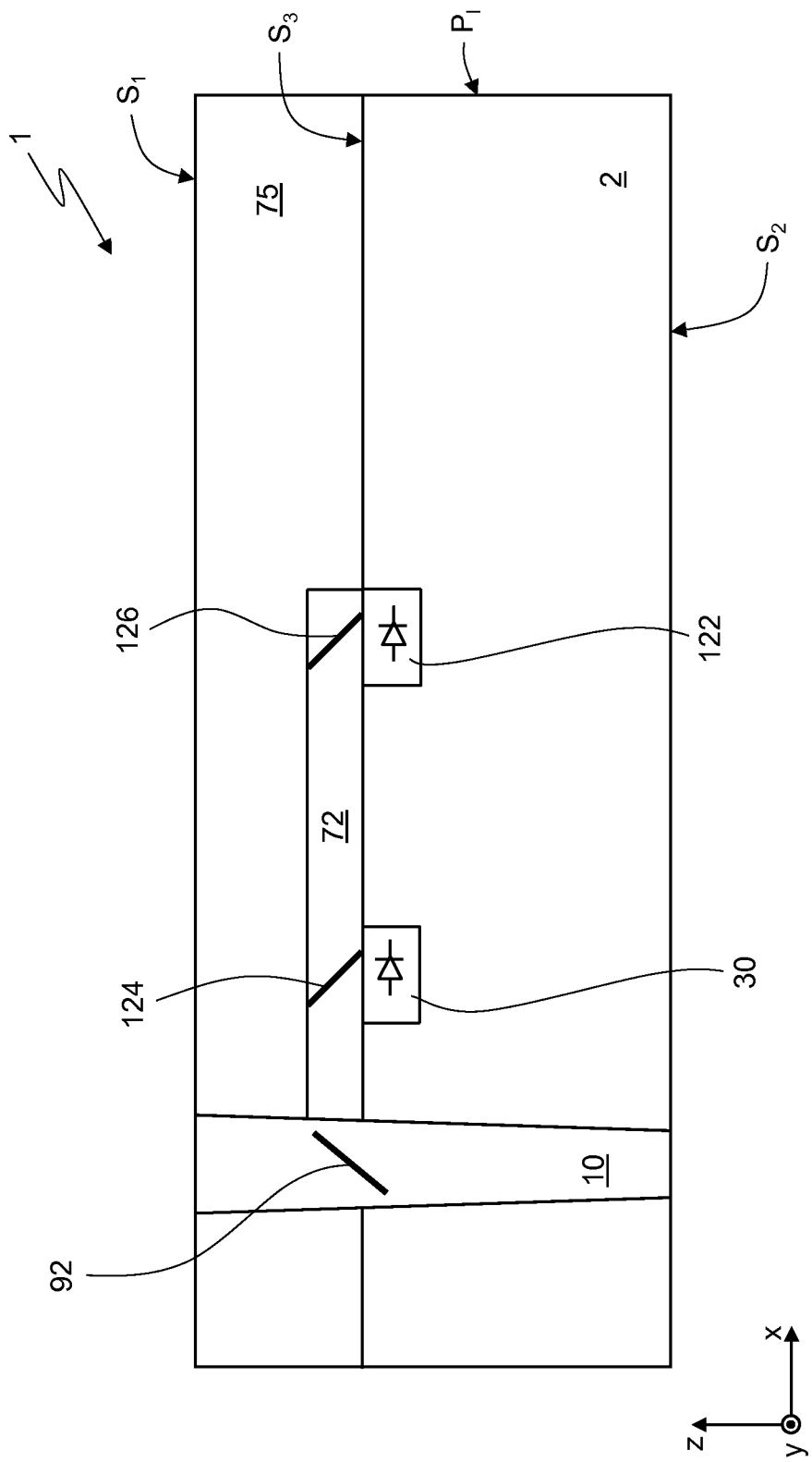

INTEGRATED OPTOELECTRONIC DEVICE AND SYSTEM WITH WAVEGUIDE AND MANUFACTURING PROCESS THEREOF

PRIORITY CLAIM

The present application claims priority to Italian Patent Application No. TO2012A000583, filed Jul. 2, 2012, which application is incorporated herein by reference in its entirety.

TECHNICAL FIELD

The present disclosure relates to an integrated optoelectronic device with a waveguide and manufacturing process thereof.

SUMMARY

As is known, there are today available numerous devices designed to communicate with other devices by means of electromagnetic radiation, referred to here in general as "optoelectronic devices".

For example, U.S. Pat. No. 7,352,066, which is incorporated herein by reference in its entirety, describes a structure including an optoelectronic emitter, a layer without electronic circuits (known as "interposer") and a horizontal waveguide. In particular, the interposer is arranged between the optoelectronic emitter and the horizontal waveguide. Moreover formed within the interposer is a through hole, also known as via, which functions as a vertical waveguide. In use, the electromagnetic radiation emitted by the optoelectronic emitter initially couples to the vertical waveguide and subsequently couples to the horizontal waveguide. The electromagnetic radiation output from the horizontal waveguide can then be received, for example, by a further device provided with a photodetector, thus obtaining an optical circuit, through which it is possible to transmit data optically. The structure described in U.S. Pat. No. 7,352,066 hence enables coupling of the optoelectronic emitter to a waveguide oriented in the direction perpendicular to the direction of emission of the optoelectronic emitter. However, it does not enable three-dimensional (3D) systems to be obtained in which two or more integrated electronic devices are arranged on top of one another and communicate optically.

U.S. Pat. No. 6,090,636, which is incorporated herein by reference in its entirety, describes instead a device that includes a first substrate of semiconductor material, formed within which are two functional electronic circuits. Moreover formed within the first substrate is an optical via, which completely traverses the first substrate. Bonded on top of the first substrate is an optical transmitter, which is formed in a second substrate, this second substrate being made of a semiconductor material different from the one that forms the first substrate. Bonded underneath the first substrate is an optical receiver, which is formed in a third substrate, this third substrate being made of a semiconductor material different from the one that forms the first substrate. Consequently, neither the optical transmitter nor the optical receiver are integrated with the two functional electronic circuits.

The device described in U.S. Pat. No. 6,090,636 hence forms a three-dimensional system formed by not more than two optoelectronic devices and by not more than three substrates. Consequently, the device described in U.S. Pat. No. 6,090,636 does not enable formation of three-dimensional systems based upon optical communication and including a greater number of devices.

Embodiments of the present disclosure provide an optoelectronic device that will overcome the drawbacks of the known art at least in part.

BRIEF DESCRIPTION OF THE DRAWINGS

For a better understanding of the present disclosure preferred embodiments thereof are now described, purely by way of non-limiting examples, with reference to the attached drawings, wherein:

FIGS. 1, 2, 4, 6-10, 13-16, 18 and 21-24 are schematic illustrations of cross sections of embodiments of the present optoelectronic device;

FIG. 20 shows a top plan view of the portion illustrated in FIG. 19a, taken along a line of cross section XX-XX indicated in FIG. 19a;

FIG. 27a-27l show cross sections of one and the same embodiment, during successive steps of a manufacturing process.

DETAILED DESCRIPTION

Figure 1:
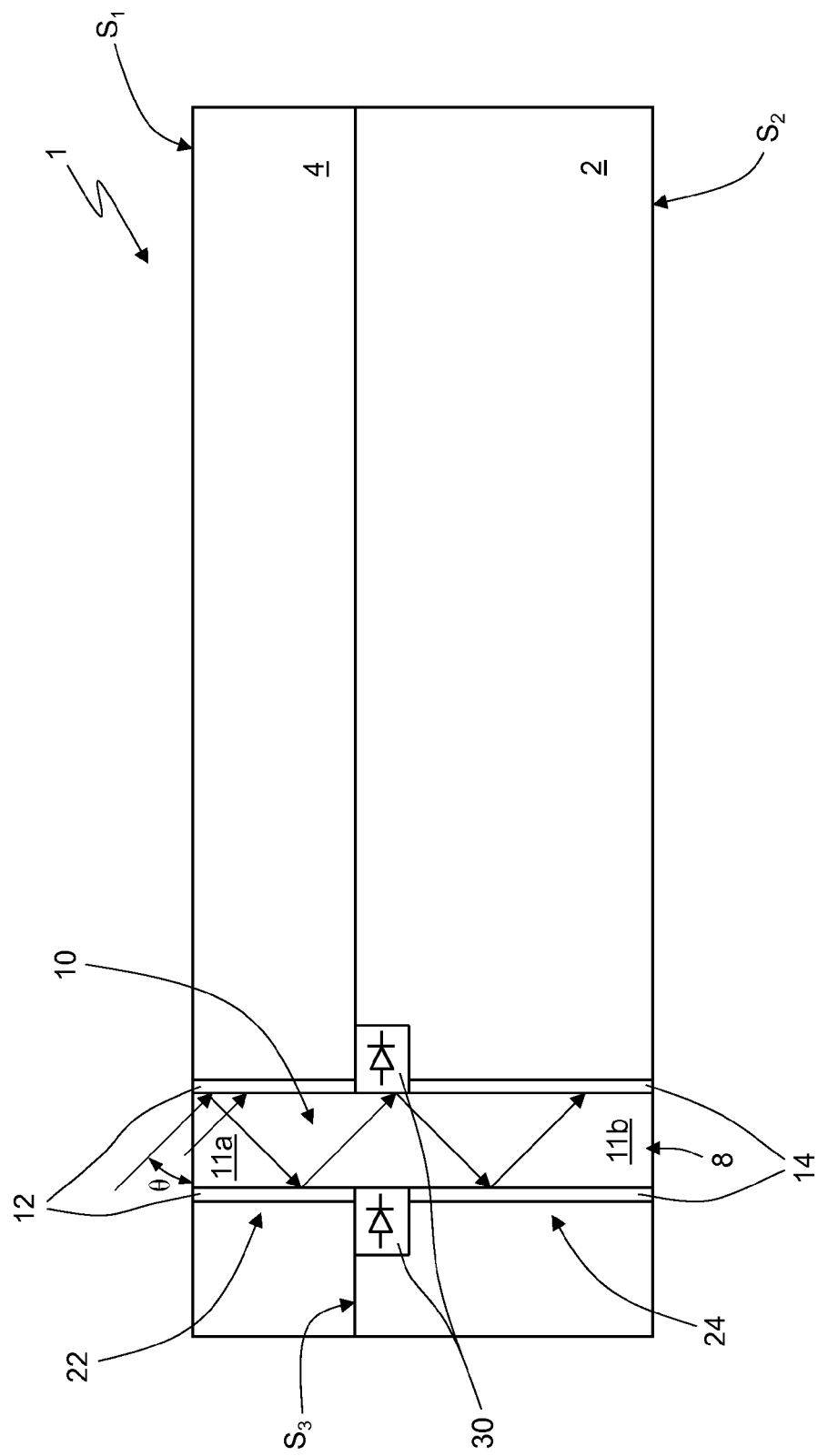

FIG. 1 shows a first optoelectronic device 1, delimited at the top and at the bottom by a top surface and a bottom surface, respectively.

The first optoelectronic device 1 includes a body of semiconductor material 2, which forms the bottom surface, and a top region 4, which is arranged on top of the semiconductor body 2 and forms the top surface. In a known way, the semiconductor body 2 includes a substrate 40 (FIG. 2) of semiconductor material, and possibly one or more epitaxial layers (not illustrated). Moreover, the top region 4 includes one or more metallizations (not illustrated), which are arranged possibly on a number of levels and are connected by vias, as well as one or more dielectric layers (not illustrated).

More particularly, the semiconductor body 2 is delimited at the top by an intermediate surface; moreover, the semiconductor body 2 is delimited at the bottom by the bottom surface.

The first optoelectronic device 1 has a through optical via 8, i.e., a hole of a through type, within which guided propagation of electromagnetic radiation can occur. The through optical via 8 extends between the top surface $S_1$ and the bottom surface $S_2$ and, hence, traverses both the top region 4 and the semiconductor body 2. The through optical via 8 is entirely filled by a core 10, which is made of a material transparent to an operating wavelength λ. Purely by way of example, the through optical via 8 may have, in top plan view, a circular shape.

The portion of through optical via 8 that traverses the top region 4 is coated with a first coating layer 12, which hence coats a corresponding top portion 11a of the core 10, with which it is in direct contact. The first coating layer 12 is moreover in direct contact with the top region 4. As illustrated in FIG. 1, the first coating layer 12 may extend between the top surface $S_1$ and the intermediate surface $S_3$.

Figure 2:
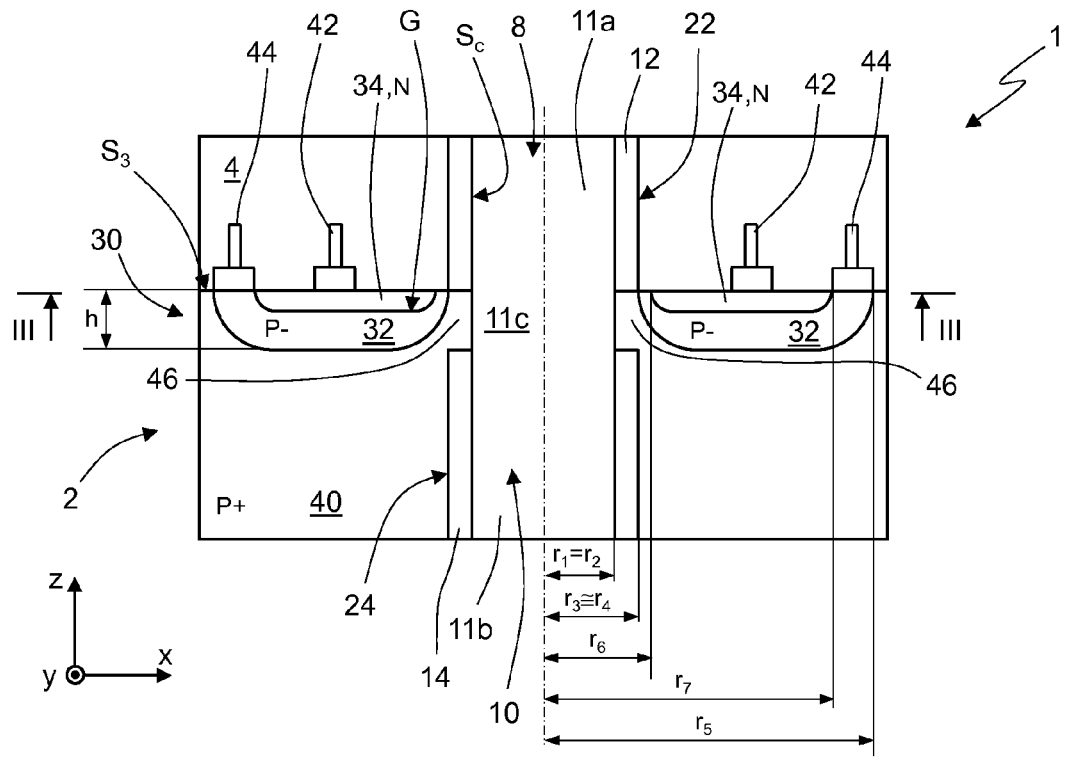
Figure 3:
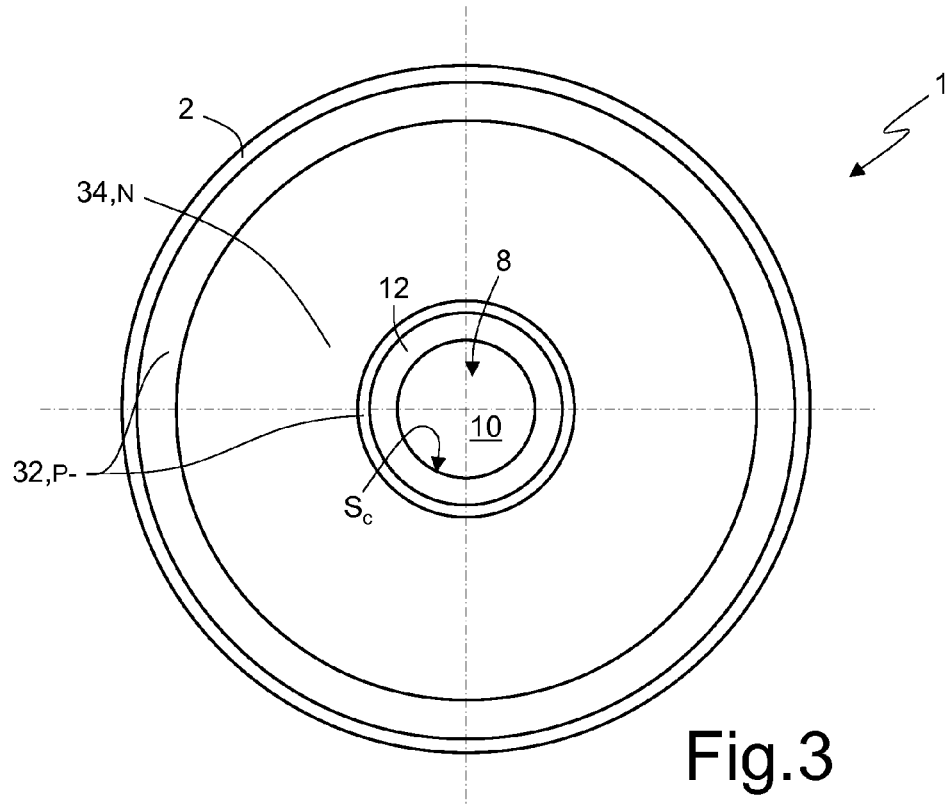
FIG. 3 shows a cross section of the embodiment illustrated in FIG. 2, taken along a line of cross section III-III indicated in FIG. 2.

The portion of through optical via 8 that traverses the semiconductor body 2 is in part coated with a second coating layer 14, which hence coats a corresponding bottom portion 11b of the core 10, with which it is in direct contact. The second coating layer 14 is moreover in direct contact with the semiconductor body 2, but it is physically separated from the first coating layer 12, so that the core 10 includes a portion that is not coated either by the first coating layer 12 or by the second coating layer 14, which is arranged between the top portion 11a and the bottom portion 11b, and which will be referred to hereinafter as "non-coated portion" 11c (FIG. 2).

The first and second coating layers 12, 14 are formed, for example, by one and the same material, which has a refractive index such that the first and second coating layers 12, 14 form, together, respectively, with the top portion 11a and the bottom portion 11b of the core 10, a first vertical waveguide 22 and a second vertical waveguide 24, within which guided propagation of electromagnetic radiation can occur at the operating wavelength λ. In other words, assuming coupling to the first vertical waveguide 22 and to the second vertical waveguide 24 radiation at the operating wavelength λ, this radiation, which will be referred to hereinafter as an "optical signal", propagates within the first and second vertical waveguides 22, 24 in a so-called guided way, experiencing the phenomenon of total reflection. For this purpose, if we designate by $n_1$ the refractive index of the material that forms the core 10 and by $n_2$ the refractive index of the material that forms the first and second coating layers 12, 14, we have $n_1 > n_2$.

Purely by way of example, the semiconductor body 2 may be made of monocrystalline silicon, which, for wavelengths in the infrared (i.e., approximately between 1.1 µm and 1.6 µm), has a refractive index equal to approximately 3.5 and exhibits leakages of the order of approximately 0.1 dB/cm. It is in any case possible to adopt different semiconductor materials. In particular, the choice of the material that forms the core 10 is made according to the operating wavelength λ.

Once again purely by way of example, for wavelengths in the infrared region, the core 10 may be formed, not only by monocrystalline silicon, but also by polycrystalline silicon or by amorphous silicon, or else again by a polymer such as the so-called SU-8. Once again by way of example, in the case of wavelengths in the visible and in the infrared region, the core 10 may be made of aluminium oxide $Al_2O_3$ or silicon oxynitride SiON, or else again a polymer such as the so-called SU-8.

Purely by way of example, for wavelengths in the infrared region, the first and second coating layers 12, 14 may be made of silicon dioxide $SiO_2$, or else aluminium oxide $Al_2O_3$, or else silicon oxynitride SiON. Once again by way of example, for wavelengths in the visible and in the infrared, the first and second coating layers 12, 14 may be made of silicon dioxide $SiO_2$.

Formed within the semiconductor body 2 is an optoelectronic component. In particular, in the embodiment illustrated in FIG. 1 a first photodiode 30 is formed, which is arranged so as to receive the optical signal. Even though it is not illustrated in FIG. 1, the first photodiode 30 is connected to an electronic circuit of a type in itself known, formed within the semiconductor body 2 and designed to process the electrical signal generated by the first photodiode 30.

In greater detail, according to an embodiment illustrated in FIG. 2, the first photodiode 30 is formed by a first well 32, formed by a corresponding portion of the semiconductor body 2, doped, for example, P and having, for example, the shape, in top plan view, of an annulus. Furthermore, the first photodiode 30 is formed by a second well 34, formed by a corresponding portion of the semiconductor body 2, doped, for example, N and having substantially the shape, in top plan view, of an annulus.

More in particular, assuming that the core 10 has a cylindrical shape with radius $r_1$ and that the first and second coating layers 12, 14 have, in top plan view, one and the same shape of an annulus with radii $r_2 = r_1$ and $r_3 > r_2$, the annulus defined by the first well 32 has radii $r_4$ and $r_5$, with $r_5 > r_4$, while the annulus defined by the second well 34 has radii $r_6$ and $r_7$, with $r_7 > r_6$. Furthermore, purely by way of example, in the embodiment illustrated in FIG. 2 it happens that $r_4 \approx r_3$ and $r_4 < r_6 < r_7 < r_5$; indicatively $r_1$ may be, for example, between 10 µm and 50 µm, the overall thickness of the first optoelectronic device 1 being, for example, between 50 µm and 200 µm. Furthermore, once again purely by way of example, the substrate 40 has a doping of a P type, with a level of doping greater than the level of doping of the first well 32. Once again purely by way of example, likewise illustrated in FIG. 2 are a first conductive connection 42 and a second conductive connection 44, which are arranged in the top region 4 and perform, in a known, the function of enabling reverse biasing of the junction G defined by the first and second wells 32, 34.

According to the embodiment illustrated in FIG. 2, the first well 32 extends into the semiconductor body 2 starting from the intermediate surface; the second well 34 also extends into the semiconductor body 2 starting from the intermediate surface $S_3$, and is surrounded at the bottom and laterally by the first well 32. The first and second wells 32, 34 surround the core 10, from which they are physically separated.

In greater detail, assuming a Cartesian reference system xyz such that the through optical via 8 extends parallel to the axis z, and the top surface $S_1$ and the bottom surface $S_2$ extend in planes parallel to the axes x and y, the first well 32 has a thickness h, measured along the axis z. Furthermore, the second coating layer 14 is at a distance equal to the thickness h from the intermediate surface $S_3$. Equivalently, the non-coated portion 11c has a thickness equal to h. Consequently, designating by $S_c$ the lateral surface of the core 10, the first well 32 does not contact the lateral surface directly. In fact, the semiconductor body 2 forms, between the first well 32 and the lateral surface $S_c$, a decoupling portion 46, which has a thickness equal to h and is precisely arranged between the first well 32 and the lateral surface $S_c$. The decoupling portion 46 surrounds the non-coated portion 11c laterally. This embodiment can hence be manufactured without the operations of etching (described hereinafter) designed to form the through optical via 8 involving the first photodiode 30. Consequently, any possible contamination of the first photodiode 30 is prevented.

Figure 4:
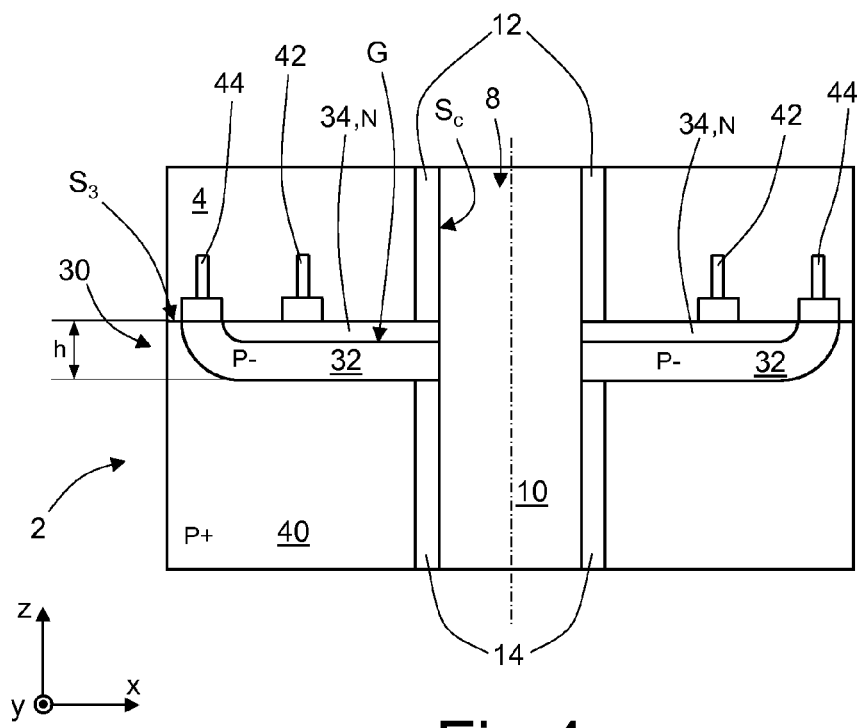

As illustrated in FIG. 4, it is in any case possible for the decoupling portion 46 to be absent, and hence for the first well 32 to be arranged in contact with the lateral surface $S_c$ in order to reduce possible coupling losses between the first photodiode 30 and the core 10. More particularly, according to this embodiment, also the second well 34 is in direct contact with the lateral surface $S_c$ of the core 10. Even though it is not illustrated in FIG. 4, a protective layer, transparent to the operating wavelength λ may in any case be present between the first photodiode 30 and the core 10.

Figure 5:
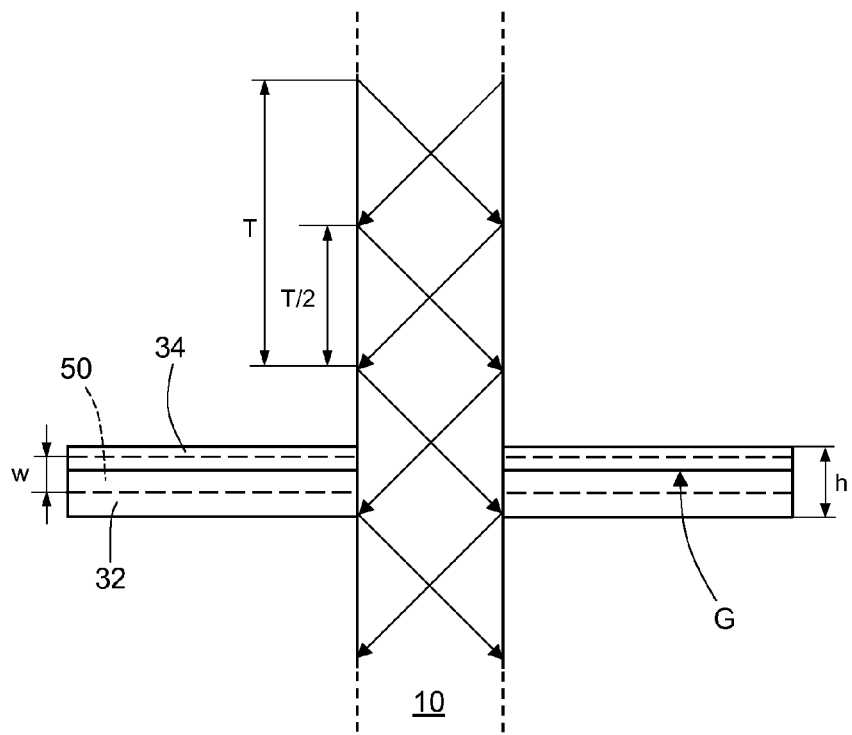
FIG. 5 is a schematic illustration of a cross section of a portion of the embodiment illustrated in FIG. 4.

As illustrated in greater detail in FIG. 5, with reference once again to the embodiment illustrated in FIG. 4, and on the hypothesis of an optical signal propagating in the core 10 starting from the top surface and in the direction of the bottom surface, it happens that the ratio between the fraction of optical signal that is absorbed by the first photodiode 30 and the fraction of optical signal that reaches the bottom surface $S_2$ is proportional to a first approximation to the ratio h/T, where T is the period of propagation of the optical signal. In particular, $T=2\pi \cdot n_1 \cdot \sin \theta / \lambda$, where θ (FIG. 1) is the angle at which the optical signal impinges upon the top surface $S_1$, this angle of incidence being greater than the critical angle defined by the materials of which the core 10 and the first and second coating layers 12, 14 are formed. In particular, also illustrated in FIG. 5 is a depletion region 50, which is set up at the interface between the first and second wells 32, 34, extending in part through these wells. The depletion region 50 has as a thickness equal to w, with w<h. In order to optimize the coupling between the through optical via 8 and the first photodiode 30, it is possible to design the first and second wells 32, 34 so that the depletion region 50 will have a refractive index substantially equal to the refractive index $n_1$ of the core 10 so as to prevent effects of reflection at the interface between the depletion region 50 and the core 10. Furthermore, it is possible to have, at the interface between the depletion region 50 and the core 10, a layer of anti-reflection material (not illustrated).

Figure 6:
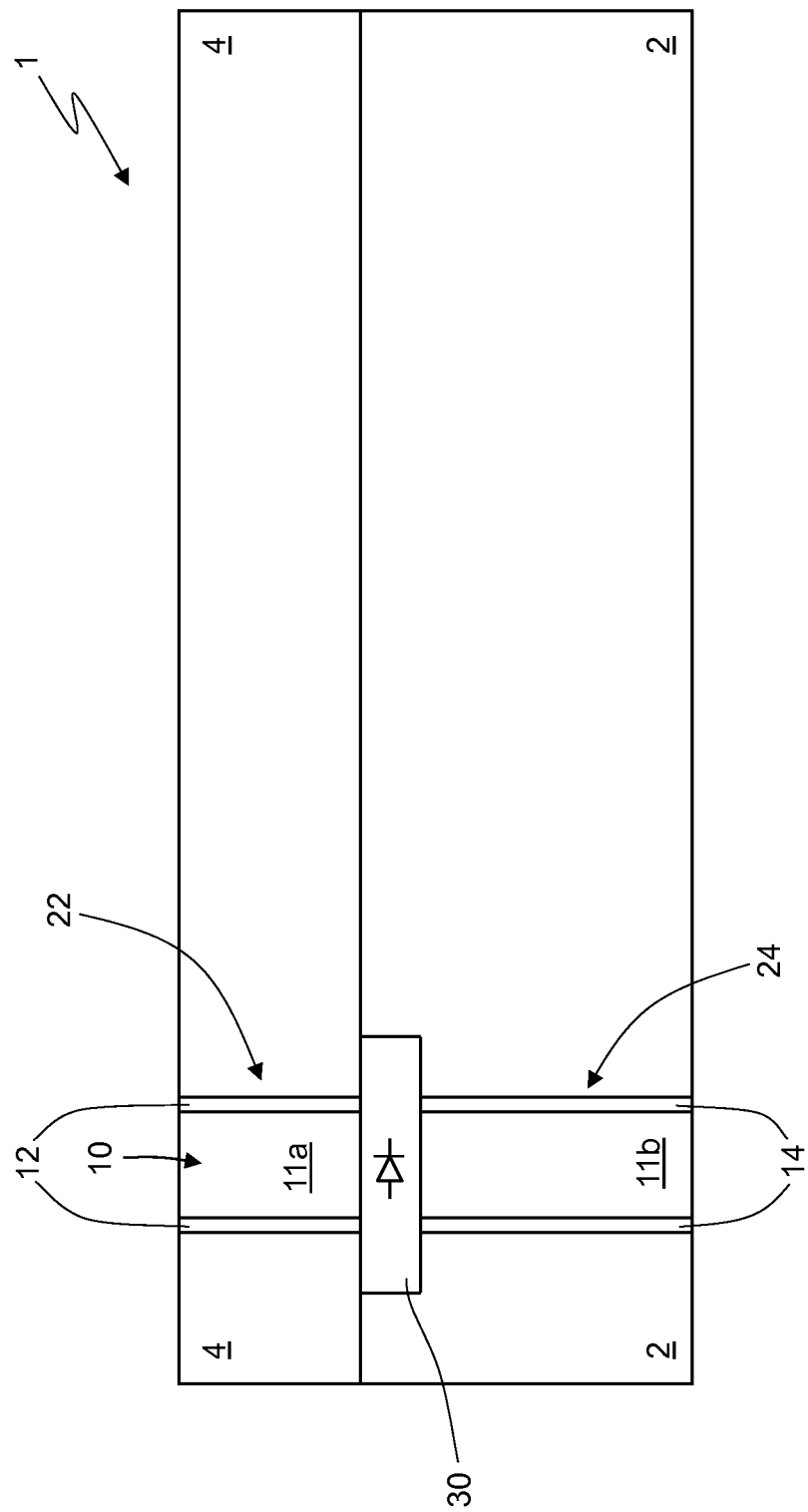

According to a different embodiment (illustrated in FIG. 6), the first photodiode 30 obstructs the through optical via 8 so that the top portion 11a and the bottom portion 11b of the core 10 are separated from one another. In practice, the aforementioned first and second vertical waveguides 22, 24 form, respectively, a first blind optical via and a second blind optical via, separate from one another.

In use, assuming that the optical signal propagates once again starting from the top surface and in the direction of the bottom surface, part of the optical signal is absorbed by the first photodiode 30, which generates a corresponding electrical signal, while part traverses the first photodiode 30 without interacting with the latter. In this connection, the fraction of optical signal that is absorbed by the first photodiode 30 is proportional to $1-e^{-\alpha w}$, where α is the coefficient of absorption, which depends upon the operating wavelength λ and upon the semiconductor material that forms the first photodiode 30.

Figure 7:
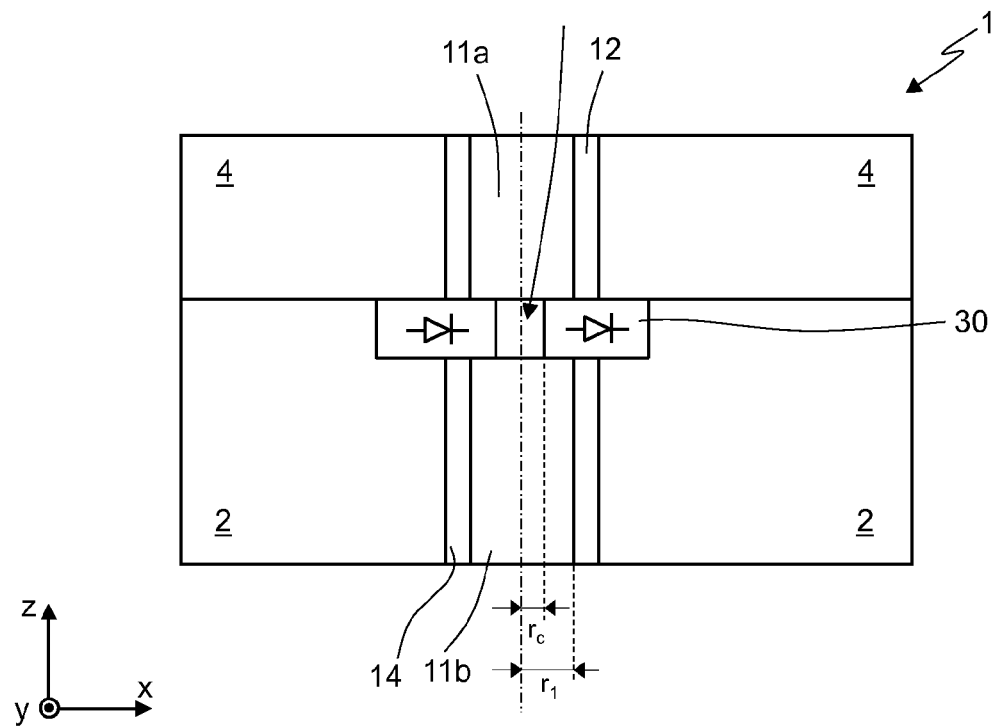

As illustrated in FIG. 7, it is moreover possible for the first photodiode 30 to be hollow, i.e., for it to form a through cavity 60, having, for example, a cylindrical shape with a radius $r_c < r_1$ and arranged, for example, aligned to the top portion 11a and to the bottom portion 11b of the core 10.

The through cavity 60 may be filled with the same material as that of the core 10. The fraction of optical signal that passes through the through cavity 60 undergoes a substantially zero attenuation. Even though it is not illustrated, according to this embodiment it is possible for the bottom portion 11b of the core 10 to be made of the same semiconductor material as that of the substrate 40 of the semiconductor body 2, with consequent simplification of the manufacturing process, described hereinafter.

Figure 8:
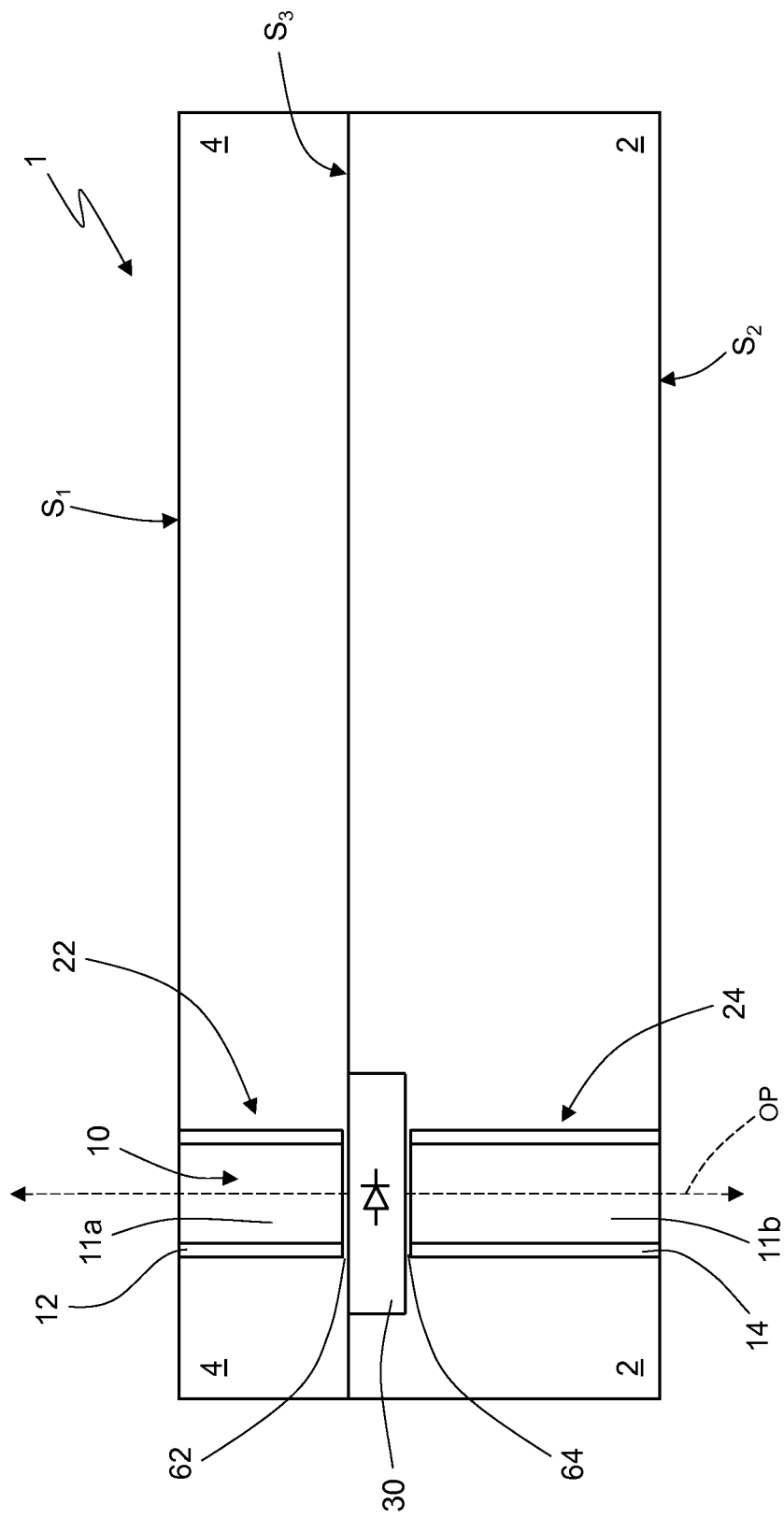

As illustrated in FIG. 8, it is likewise possible that a first intermediate region 62 is present between the first vertical waveguide 22 and the first photodiode 30, which extends on the intermediate surface $S_3$.

Furthermore, between the first photodiode 30 and the second vertical waveguide 24 there may be formed a second intermediate region 64, which performs the function of preventing possible damage to the crystalline structure of the first photodiode 30 during the manufacturing steps.

The top portion 11a and bottom portion 11b of the core 10, the first and second intermediate regions 62, 64, and the first photodiode 30 form an optical path OP, which is in part of a guided type and extends between the top surface $S_1$ and the bottom surface $S_2$ of the first optoelectronic device 1, traversing the semiconductor body 2. The optical path OP optically couples the first photodiode 30 to a first portion of free space and a second portion of free space, which are arranged, respectively, on top of the top surface $S_1$ and underneath the bottom surface $S_2$, i.e., it enables the first photodiode 30 to receive possible light signals that come from these first and second portions or directions of free space. For this purpose, the optical path OP couples the first photodiode 30 both to the first portion of free space and to the second portion of free space, introducing, respectively, a first attenuation and a second attenuation (at the operating wavelength λ), which, in the case of the core 10 made of silicon and for wavelengths in the infrared, are to a first approximation negligible, i.e., less than 0.1 dB. Furthermore, in the embodiment illustrated in FIG. 8, the optical path OP is directed along the axis z, i.e., the respective guided portions (in the case in point, the first vertical waveguide 22 and the second vertical waveguide 24) have axes parallel to the axis z.

Figure 9:
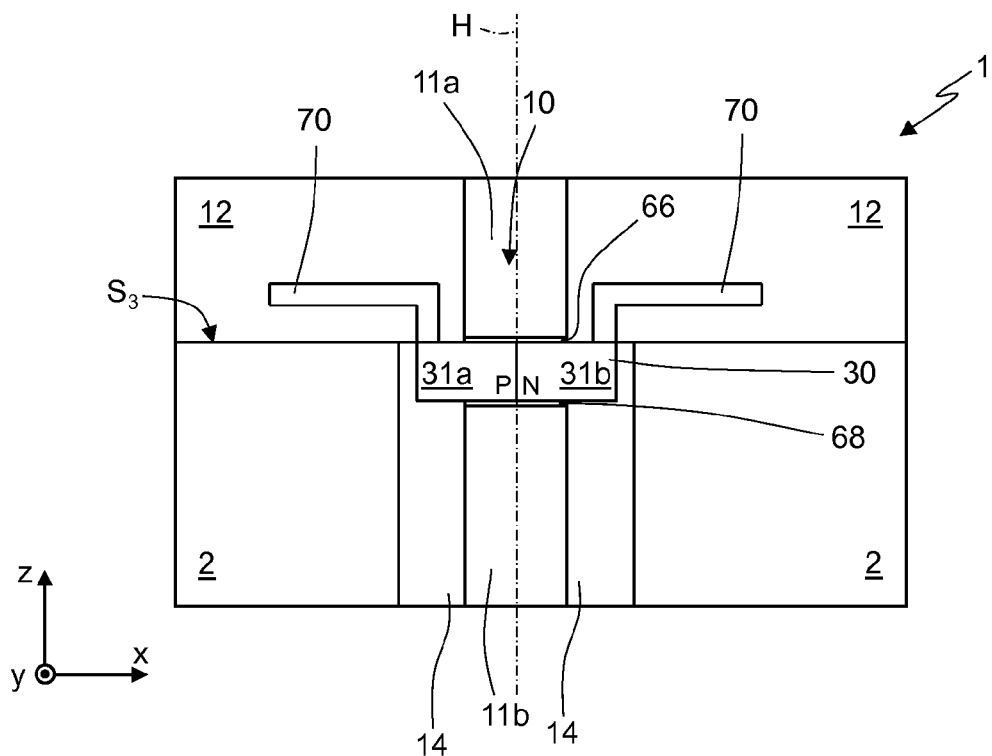

As illustrated in FIG. 9, likewise possible are embodiments in which the first photodiode 30 comprises a first area 31a and a second area 31b, which have opposite types of doping and are arranged alongside one another, in direct contact. In particular, both the first area 31a and the second area 31b extend starting from the intermediate surface $S_3$. Even more in particular, the first and second areas 31a, 31b are arranged specular to one another, with respect to an axis H parallel to the axis z and defined by the longitudinal axes (aligned with one another) of the top portion 11a and of the bottom portion 11b of the core 10. Furthermore, a first anti-reflection layer 66 is arranged between the top portion 11a of the core 10 and the first photodiode 30. In particular, the first anti-reflection layer 66 overlies both the first area 31a and the second area 31b. Moreover arranged between the first photodiode 30 and the second portion 11b of the core 10 is a second anti-reflection layer 68, which is overlaid both by the first area 31a and by the second area 31b. The first and second anti-reflection layers 66, 68 are, respectively, surrounded by the first and second coating layers 12, 14. In this connection, the first coating layer 12 has a dimension, measured along the axis x, greater than the corresponding dimension of the second coating layer 14 and houses metallizations 70 designed to enable biasing of the first and second areas 31a, 31b. Furthermore, the second coating layer 14 extends so as to surround also the first and second areas 31a, 31b of the first photodiode 30 in order to insulate them electrically. In a way in itself known, the first and second anti-reflection layers 66, 68 have thicknesses that are multiples of λ/4 in order to compensate for possible variations of refractive index of the first photodiode 30 with respect to the core 10, due, for example, to doping of the first and second areas 31a, 31b. In order to reduce these variations of refractive index, it is, for example, possible, as mentioned previously, for the bottom portion 11b of the core 10 to be made of semiconductor material, such as, for example, monocrystalline silicon. In this case, the second anti-reflection layer 68 may be formed, for example, by the buried oxide layer of a structure known as "silicon on insulator" (SOI). The top portion 11a of the core 10 may moreover be made of semiconductor material, such as, for example, amorphous silicon.

Figure 10:
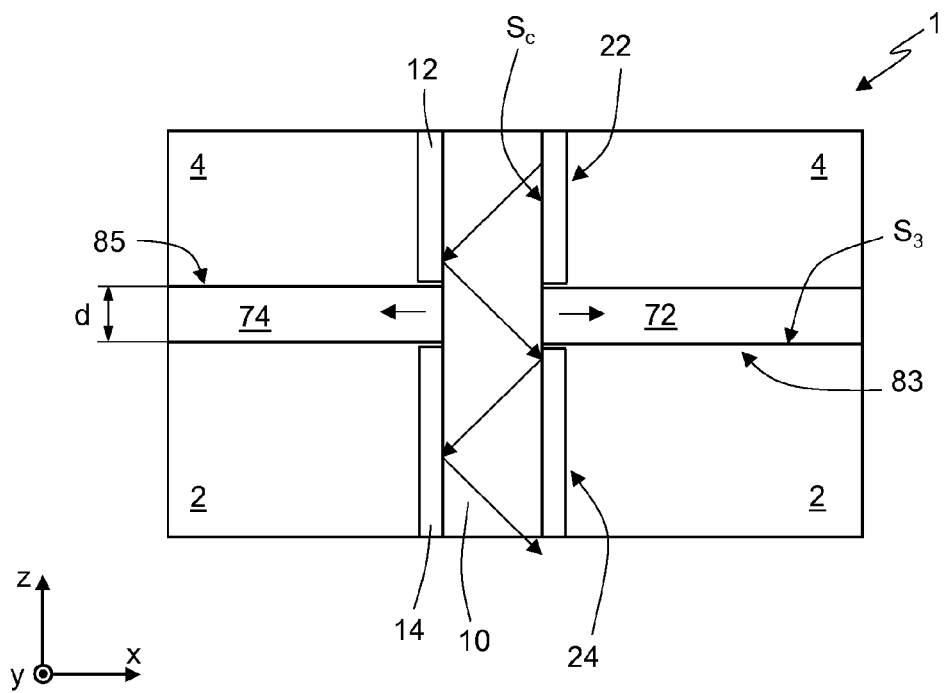

As illustrated in FIG. 10, according to further embodiments, the first optoelectronic device 1 comprises a first transverse channel 72 and a second transverse channel 74, which have, for example, the shape of parallelepipeds with a square or rectangular base, these parallelepipeds having equal bases, being aligned with one another and being arranged, for example, parallel to the axis x. The first and second transverse channels 72, 74 are made of a material such that they form, respectively, together with a top region 4 and a semiconductor body 2, with which they are in direct contact, a first transverse waveguide 83 and a second transverse waveguide 85.

For example, the first and second transverse channels 72, 74 may be made of the same material as that of the core 10 in order to optimize the optical coupling between the core 10 itself and the first and second transverse waveguides 83, 85.

In detail, the first and second transverse channels 72, 74 extend on top of the semiconductor body 2, with which they are in direct contact, and underneath the top region 4, with which they are in direct contact, even though in any case possible are embodiments in which the first and second transverse channels 72, 74 extend entirely within the semiconductor body 2. Furthermore, the first and second transverse channels 72, 74 are in direct contact with the core 10, to the lateral surface $S_c$ of which they are tangential. Consequently, the first and second transverse channels 72, 74 are both partially overlaid by the first coating layer 12, and moreover partially overlie the second coating layer 14. In this way, part of the optical signal can couple both to the first transverse waveguide 83 and the second transverse waveguide 85, after prior propagation along the first vertical waveguide 22 or the second vertical waveguide 24. In this embodiment, the first photodiode 30 (not illustrated in FIG. 10) may hence be arranged so as to receive the optical signal from the core 10 and/or the first and second transverse channels 72, 74.

In greater detail, it is possible to demonstrate that, designating by d the thickness of the first and second transverse channels 72, 74 along the axis z, the fraction of optical signal that changes its own direction of propagation, coupling to the first and second transverse channels 72, 74 increases as the thickness d increases and is approximately equal to 50% in the case where d≈T/2. Furthermore, in this embodiment, it is preferable for the first and second vertical waveguides 22, 24, which in general may be either of the so-called multimodal type and of the so-called monomodal type, to be of the multimodal type so that the period of propagation T is comparable with the physically attainable thickness d, the latter being of the order of a few microns.

Figure 11:
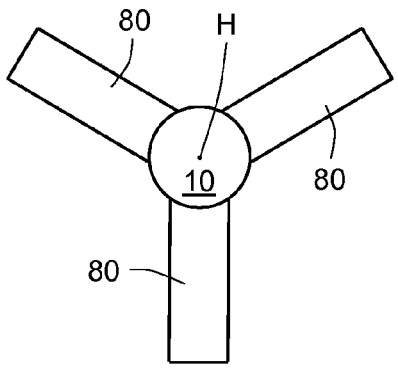
FIG. 11 is a schematic illustration of a top plan view of a portion of a further embodiment of the present optoelectronic device.

As illustrated in FIG. 11, moreover possible are embodiments in which more than two transverse channels are present (designated as a whole by 80), which, purely by way of example, are arranged radially about the axis H, spaced at equal angular distances apart.

Figure 12:
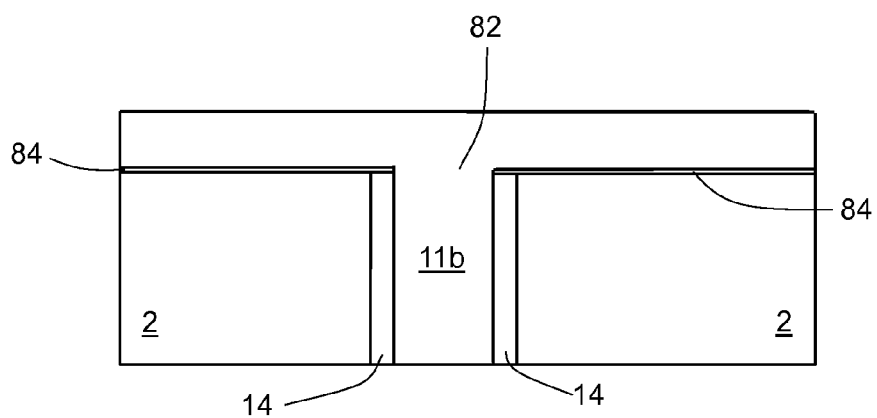
FIG. 12 is a schematic illustration of a cross section of a portion of one embodiment of the present optoelectronic device.

As illustrated in FIG. 12, according to a possible embodiment, the first and second transverse channels 72, 74 and the bottom portion 11b of the core 10 are formed by using a SOI structure in which the buried oxide layer (designated by 84) is shaped in order to remove the presence thereof on top of the bottom portion 11b. In this case, the first and second transverse channels 72, 74 form an overall channel 82. Moreover, the buried oxide layer 84 overlies the second coating layer 14, with which it is in direct contact. According to this embodiment, the overall channel 82 and the bottom portion 11b of the core 10 are made of one and the same material, such as, for example, monocrystalline silicon. The overall channel 82 is delimited laterally, in a way not illustrated, by means of diggings or trenches filled with dielectric material.

According to a further embodiment (illustrated in FIG. 13), the first and second transverse channels 72, 74 are at least in part tapered, moving away from the axis H, in order to optimize the electromagnetic coupling between the optical signal, which propagates along the core 10, and the first and second transverse channels 72, 74. The first photodiode 30 may hence be arranged at the ends of the first and second transverse channels 72, 74. Furthermore, instead of the top region 4, there may be present a coating region 75, which forms the top surface $S_1$ of the first optoelectronic device 1 and forms a sort of coating of the top portion 11a of the core 10 and of the first and second transverse channels 72 and 74.

In detail, the first coating layer 12 is absent. Consequently the top portion 11a of the core 10 is in direct contact with the coating region 75, which, in addition to surrounding the top portion 11a of the core 10, overlies both the first transverse channel 72 and the second transverse channel 74, with which it is in direct contact. Purely by way of example, the bottom portion 11b of the core 10 may be slightly tapered downwards, according to the manufacturing process adopted for forming the bottom portion 11b of the core 10.

In greater detail, the coating region 75 is made of a material having a refractive index less than the refractive index of the material that forms the first and second transverse channels 72, 74. For example, the coating region 75 may have a refractive index equal to $n_2$, the first and second transverse channels 72, 74 having a refractive index equal to $n_1$. For example, the coating region 75 may be made of one of the materials cited previously in connection with the first coating layer 12.

The second coating layer 14 extends at least in part on top of the intermediate surface $S_3$ and delimits at the bottom the second transverse channel 74, with which it is in direct contact. The second coating layer 14 moreover extends underneath the first transverse channel 72, which is, however, delimited at the bottom by a third coating layer 88, which is arranged between the second coating layer 14 and the first transverse channel 72 and is in direct contact with them. The third coating layer 88 is made of a material having a refractive index less than the refractive index of the material forming the first and second transverse channels 72, 74 and the core 10. In particular, the third coating layer 88 may be made of a material chosen from among the materials cited previously in connection with the first coating layer 12. Purely by way of example, the coating region 75 and the first and third coating layers 14, 88 may be made of one and the same material. In a variant, the third coating layer 88 may be absent.

Once again in greater detail, the first optoelectronic device 1 comprises a first optical beam splitter 90, i.e., a device designed to receive an optical beam and transmit a first part thereof and reflect a second part thereof, in different directions. The first optical beam splitter 90 is formed by a first element 92 of a layered type. The first element 92 is arranged inclined with respect to the axis H, the geometrical center of the first element 92 lying along the axis H. In detail, the first element 92 is inclined with respect to the axis H by an angle between 10° and 80°, and in particular between 30° and 60°. For example, this angle may be equal to 45°.

The first element 92 is arranged in contact both with the coating region 75 and with the third coating layer 88. In particular, the first element 92 is arranged within the core 10 so as to occlude the core 10 itself completely, i.e., it has dimensions and arrangement such as to separate the top portion 11a and the bottom portion 11b of the core 10 from one another, as well as the first and second transverse channels 72, 74, which are instead in direct contact with the top portion 11a and the bottom portion 11b, respectively, of the core 10. The first element 92 is hence arranged so that, irrespective of whether the optical signal propagates along the through optical via 8 from above downwards, i.e., starting from the top surface $S_1$ and in the direction of the bottom surface $S_2$, or vice versa from beneath upwards, the optical signal itself impinges upon the first element 92.

The first element 92 is made, for example, of the same material as that of the third coating layer 88, so it is made of a material different from the material of the core 10, and in particular is made of a material having a refractive index less than the refractive index of the material that forms the core 10 and the first and second transverse channels 72, 74. For example, the first element 92 may be made of silicon oxide. In this case, the core 10 and the first and second transverse channels 72, 74 may be made, for example, of amorphous silicon, the second and third coating layers 14, 88 being made of silicon oxide. According to this embodiment, the critical angle is approximately equal to 23°.

In use, upon impinging of the optical signal on the first element 92 with an angle of incidence greater than the critical angle, a first part of the optical signal continues to propagate along the through optical via 8, and hence traverses the first element 92, while a second part of the optical signal is reflected by the first element 92 and couples alternatively to the first transverse channel 72 or the second transverse channel 74. Purely by way of example, in the embodiment illustrated in FIG. 13, in the case where the optical signal propagates in the through optical via 8 from above downwards, the aforementioned second part is reflected by the first element 92 in the first transverse channel 72, whereas, in the case where the optical signal propagates from beneath upwards, the aforementioned second part is reflected in the second transverse channel 74.

It should be noted that, notwithstanding the fact that the optical signal impinges upon the first element 92 with an angle of incidence greater than the critical angle, the first element 92 enables in any case passage of the aforementioned first part of the optical signal, thanks to the so-called phenomenon of optical tunneling, this phenomenon consisting in the coupling of the evanescent field downstream of the first element 92 with the guided mode/modes of the waveguide arranged downstream of the first element 92. The phenomenon of optical tunneling, and hence the amount of the aforementioned first part of the optical signal, increases as the thickness of the first element 92 decreases and is appreciable for thicknesses of the first element of the order of $\lambda/10$. For example, in the case of $\lambda=1.5$ µm, the thickness of the first element 92 may be in the interval [0.05-0.15]µm. Instead, the amount of the aforementioned second part of the optical signal, reflected by the first element 92, decreases as the thickness of the first element 92 decreases, given the same angle of incidence. Advantageously, the first element 92 can be obtained via a process of deposition and may hence have a very limited and well controlled thickness (even less than 50 nm).

Figure 13:
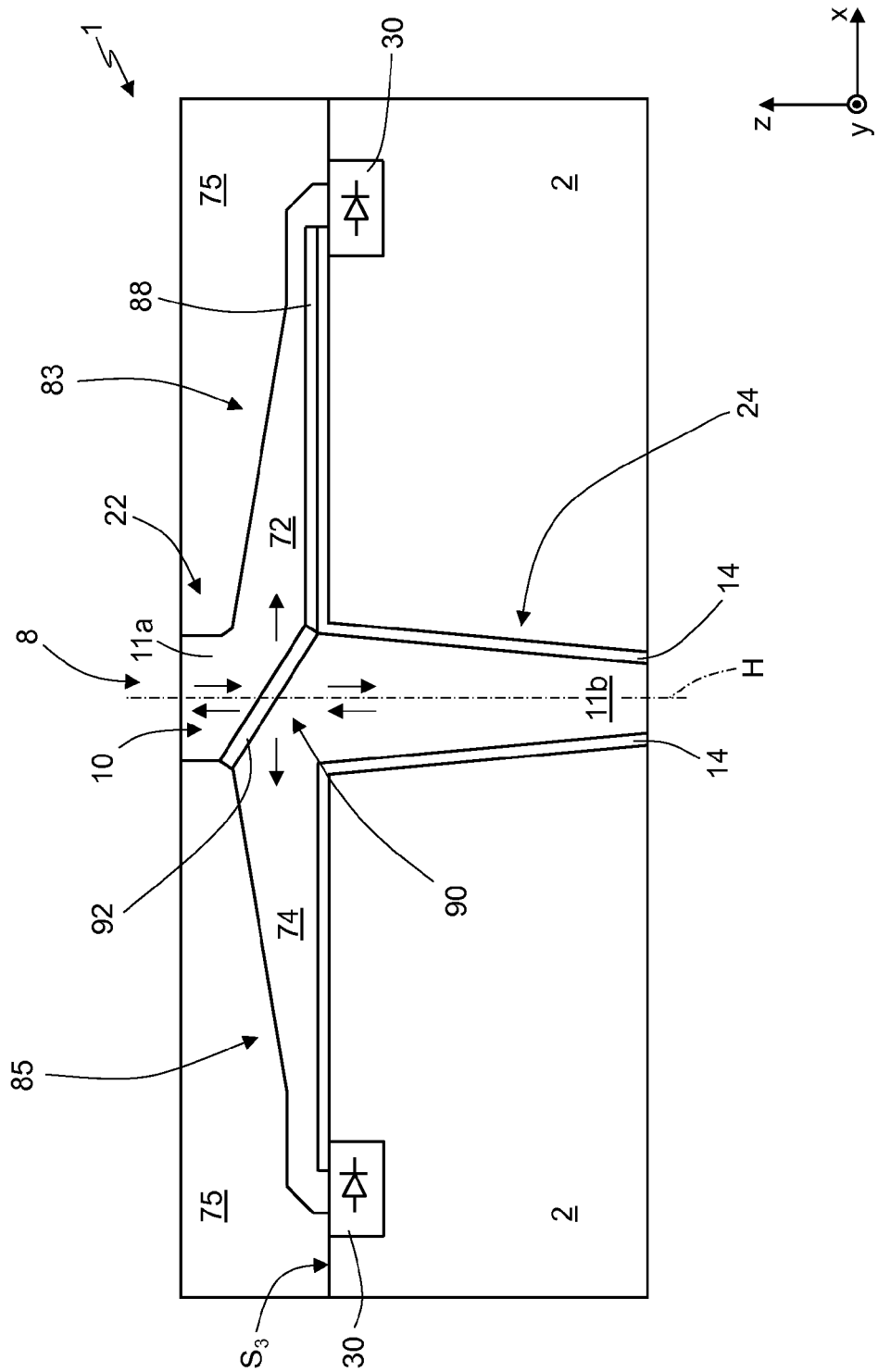

In order to optimize operation of the embodiment illustrated in FIG. 13, it is possible to size the core 10 so that the first and second vertical waveguides 22, 24 are of a monomodal type, or else are of a multimodal type.

Figure 14:
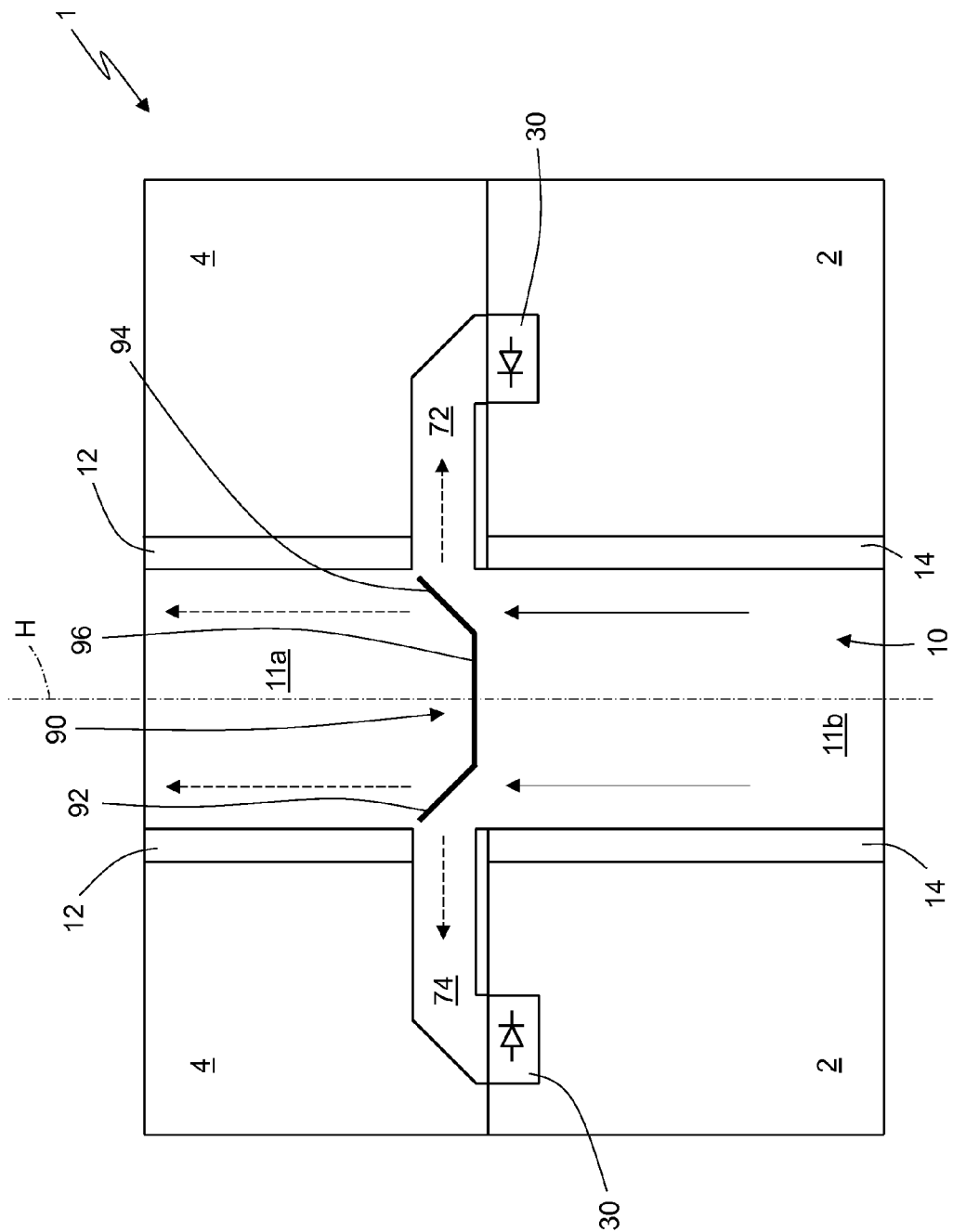

Embodiments of the type illustrated in FIG. 14 are in any case possible, where the first optical beam splitter 90 includes a second element 94 and a third element 96, which are also of a layered type and are made, for example, of the same material as that of the first element 92, Moreover, the first, second, and third elements 92-96 may have one and the same thickness. In this embodiment, the first and second elements 92, 94 are arranged specularly to one another, with respect to the axis H, and both contact the third element 96, which is arranged laterally between them. In other words, the first and second elements 92, 94 are arranged so as to form with the axis z equal angles, but with opposite sign (for example, +45° and −45°). Furthermore, the first and second elements 92, 94 are arranged laterally at a distance from the first axis H, while the geometrical center of the third element 96 lies along the axis H, the same third element 96 being arranged perpendicular to the axis H.

More in particular, the first, second, and third elements 92-96 are arranged at a lateral distance from the first and second coating layers 12, 14 and from the semiconductor body 2 so that the first optical beam splitter 90 does not occlude the core 10 completely, i.e., in top plan view, the geometrical shape defined by the first optical beam splitter 90 does not intersect the geometrical shape (circle) defined by the core 10, nor is it tangential to the latter. The optical beam splitter 90 thus formed renders the geometrical dimensions of the core 10 and of the first and second transverse channels 72, 74 independent.

Operatively, according to the embodiment illustrated in FIG. 14, it is possible to deflect the optical signal in the first and second transverse channels 72, 74 only if the optical signal itself propagates from beneath upwards.

Embodiments are in any case possible in which the third element 96 is absent in order to increase the fraction of the optical signal that is transmitted by the first optical beam splitter 90. Moreover possible are embodiments of the type illustrated in FIG. 15, where the first optical beam splitter 90 comprises a fourth element 98, a fifth element 100, and a sixth element 102, which are of a layered type and are arranged so that it is possible to define an axis O, parallel to the axis x, perpendicular to the axis H, and such that the fourth, fifth, and sixth elements 98, 100, 102 are, respectively, specular, with respect to the axis O, to the first, second, and third elements 92-96. Consequently, the fourth element 98 and the fifth element 100 are arranged specularly to one another, with respect to the axis H. Furthermore, the fourth element 98 is in contact not only with the sixth element 102 but also with the first element 92, with which it forms an angle of, for example, 90°. The fifth element 100 is arranged in contact not only with the sixth element 102 but also with the second element 94, with which it forms an angle, for example, of 90°. The sixth element 102 is hence arranged laterally between the fourth and fifth elements 98, 100, and has a respective geometrical center that lies along the axis H. Also the fourth, fifth, and sixth elements 98-102 are arranged at a lateral distance from the first and second coating layers 12, 14 and from the semiconductor body 2 so that the first optical beam splitter 90 does not occlude the core 10 completely.

Figure 15:
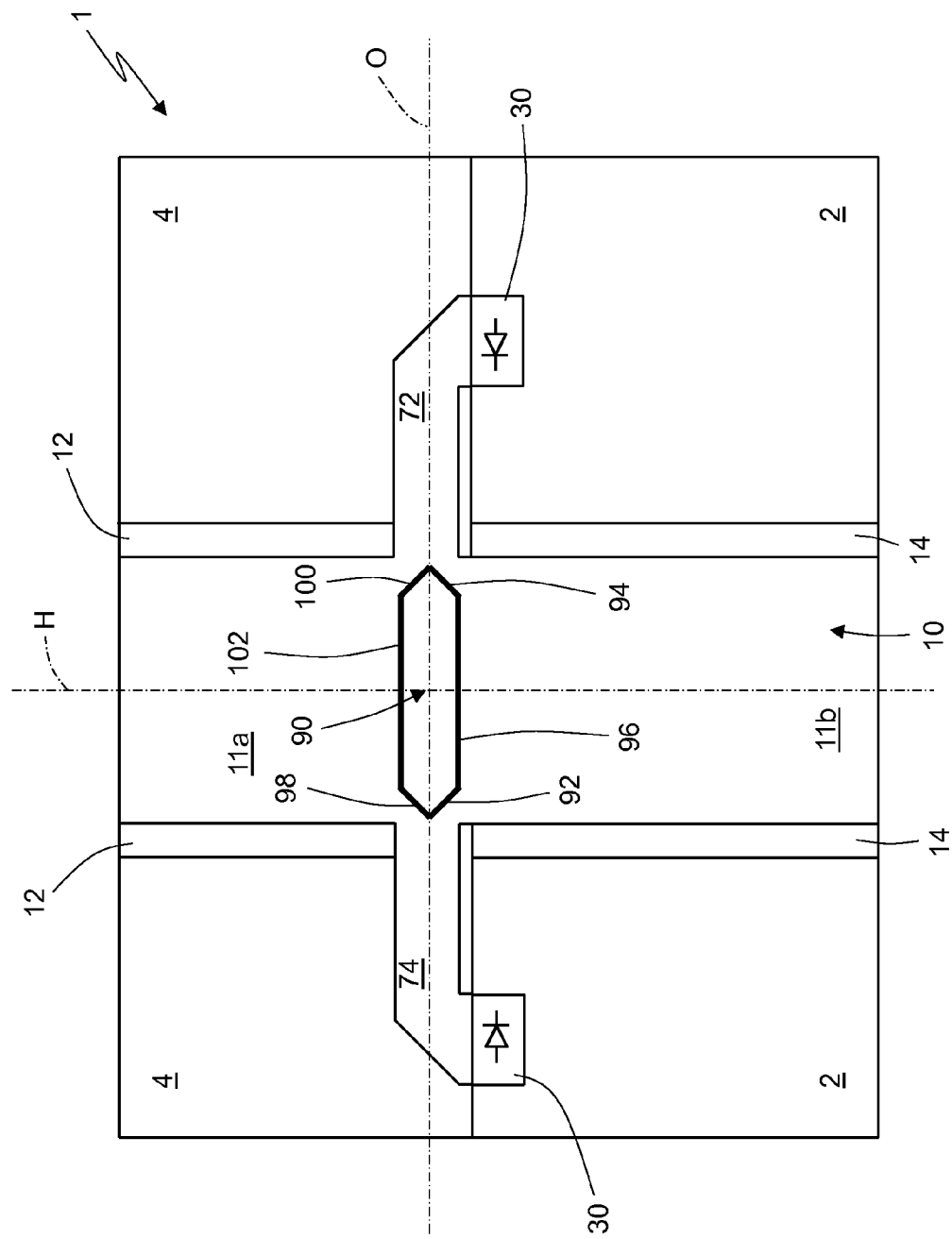

Operatively, the embodiment illustrated in FIG. 15 enables deflection of the optical signal in the first and second transverse channels 72, 74, both when it propagates from beneath upwards and when it propagates from above downwards.

Figure 16:
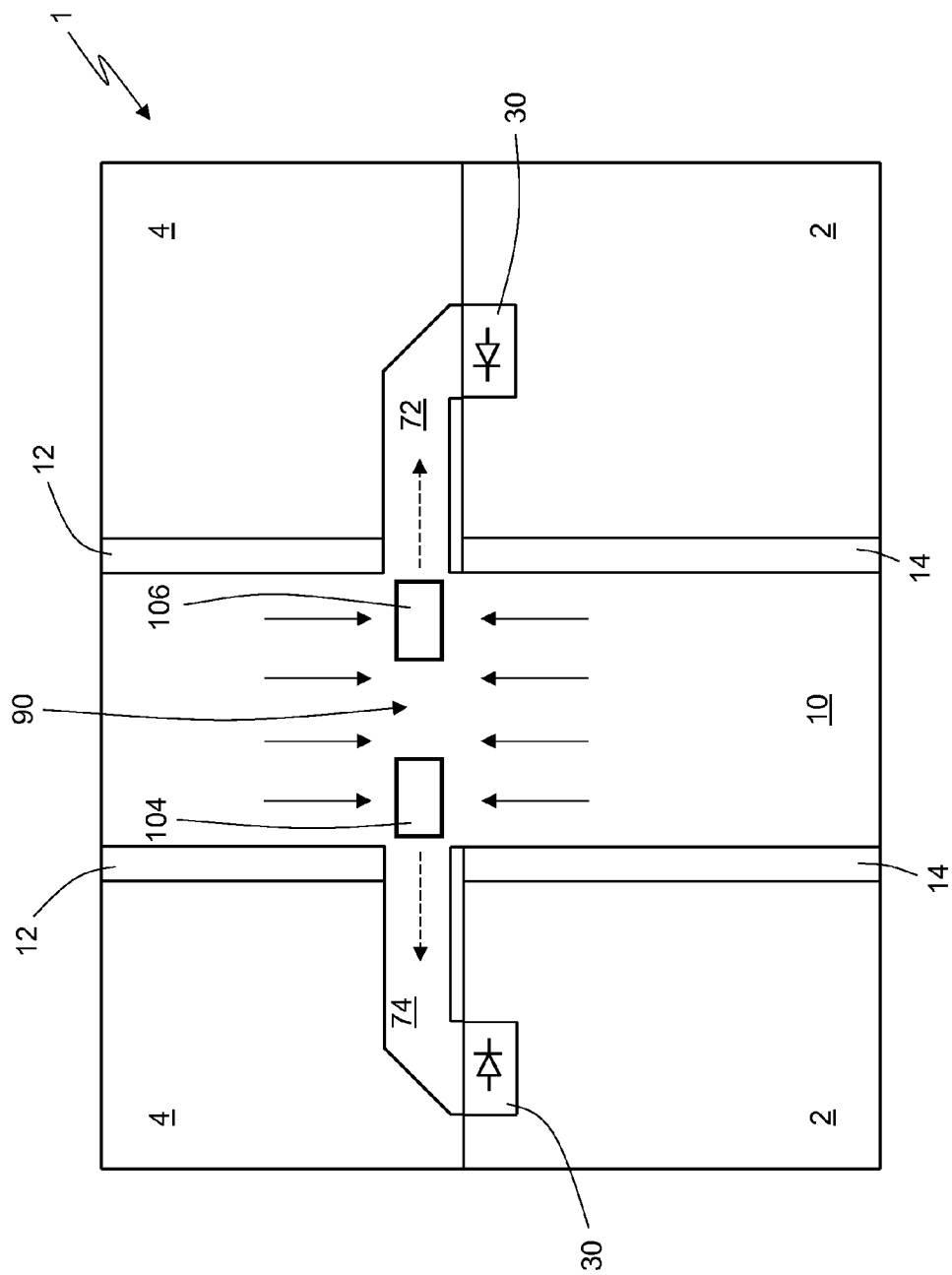

Moreover possible are embodiments (not illustrated) similar to the embodiment illustrated in FIG. 15, but in which the third and sixth elements 96, 102 of the first optical beam splitter 90 are absent, as well as embodiments in which, as illustrated in FIG. 16, the first optical beam splitter 90 is formed by a first reflecting region 104 and by a second reflecting region 106. In particular, each one between the first and second reflecting regions 104, 106 is made of a host material, such as, for example, a polymer matrix, distributed within which are reflecting particles, such as, for example, metal particles, which perform the function of spreading the optical signal in the various directions.

It should be noted that, purely by way of example, in the embodiments illustrated in FIGS. 14-16, the first and second transverse channels 72, 74 are formed within the top region 4 instead of being surrounded by the coating region 75.

Figure 17:
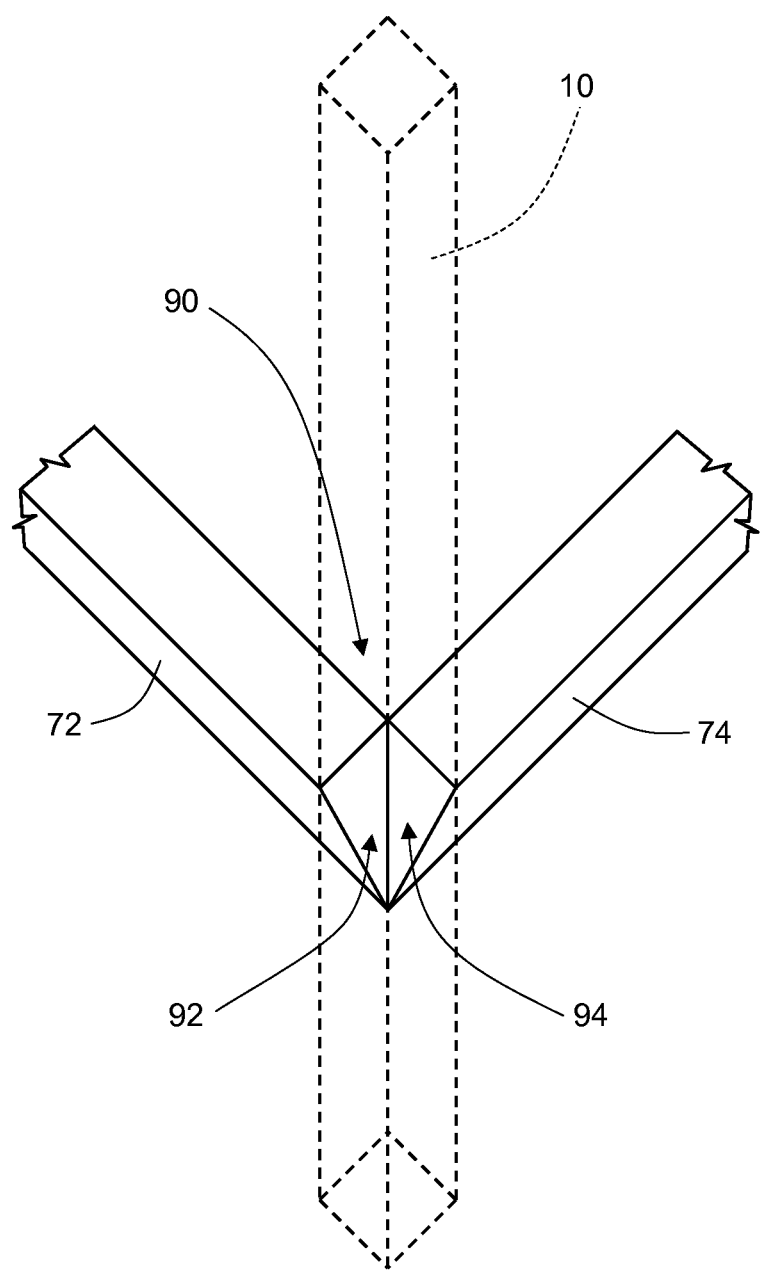
FIG. 17 shows a perspective view of a portion of a further embodiment of the present optoelectronic device.

As illustrated in FIG. 17, embodiments are possible in which the first and second transverse channels 72, 74 are arranged orthogonally with respect to one another, in which case the first optical beam splitter 90 includes the first and second elements 92, 94. In particular, in FIG. 17 it has been assumed, for simplicity of illustration, that the first and second elements are of a negligible thickness and that the core 10 has a square cross section. On this hypothesis, it may be noted how the first and second elements 92, 94 have the shapes of two right-angle triangles lying in two planes orthogonal to one another, and the hypotenuses of which are in contact with one another. Furthermore, the first element 92 lies in a plane, the normal of which, in the point of intersection with the axis of the first transverse channel 72, forms with the latter an angle of 45°. Likewise, the second element 94 lies in a plane, the normal of which, in the point of intersection with the axis of the second transverse channel 74, forms with the latter an angle of 45°.

Figure 18:
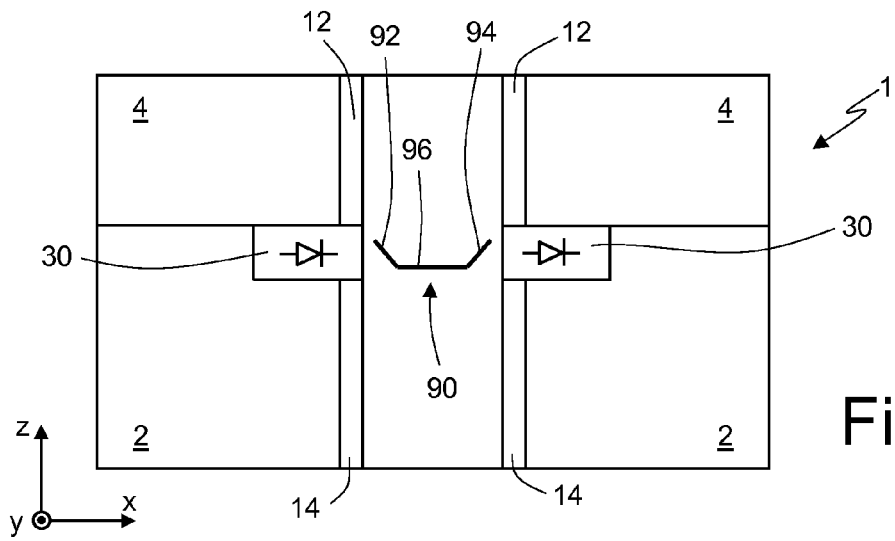

As illustrated in FIG. 18, moreover possible are embodiments in which the first and second transverse channels 72, 74 are absent. In this case, the first photodiode 30, and hence the first and second wells 32, 34, are in contact with the core 10. Moreover, the first optical beam splitter 90 is arranged so as to reflect part of the optical signal in the direction of the first photodiode 30. Purely by way of example, the embodiment illustrated in FIG. 18 uses a first optical beam splitter 90, which is the same as the first optical beam splitter illustrated in FIG. 14; it is, however, possible to use any of the optical beam splitters previously illustrated or described.

In order to increase the coupling between the first photodiode 30 and the transverse channels, it is moreover possible to adopt the embodiments illustrated in FIGS. 19a-19c and 20.

In detail, with reference, purely by way of example, to just the first transverse channel 72, it defines a contact portion 110, which occupies a recess 112 formed by the semiconductor body 2. Moreover, the contact portion 110 is in direct contact with the first photodiode 30, and in particular is in contact with the junction G defined by the first and second wells 32, 34. In other words, the contact portion 110 is in contact with the first and second wells 32, 34, as well as, consequently, with the depletion region 50.

In greater detail, the recess 112 is delimited laterally by a first inclined wall $S_{i1}$ and by a second inclined wall $S_{i2}$, onto which the junction G gives out.

The first and second inclined walls $S_{i1}$, $S_{i2}$ are of a planar type and are arranged transverse to the intermediate surface $S_3$, which defines a sort of main surface that delimits the semiconductor body 2 at the top. Furthermore, the first and second inclined walls $S_{i1}$, $S_{i2}$ are arranged specular to one another, with respect to a plane parallel to the plane yz. Consequently, the first and second inclined walls $S_{i1}$, $S_{i2}$ form an angle φ between 10° and 170°, and in particular between 70° and 110°; for example, the angle φ is equal to 90°.

In greater detail, according to one embodiment (FIG. 19a), the first and second inclined walls $S_{i1}$, $S_{i2}$ both overlie the depletion region 50 and are in contact with one another so as to form a cusp shape; in particular, the first and second inclined walls $S_{i1}$, $S_{i2}$ both have the shape of a rectangle, these two rectangles having two bases (or heights) that coincide, defining a line of contact L (represented in FIG. 20), which lies within the first well 32. Furthermore, both the first and second inclined walls $S_{i1}$, $S_{i2}$ are in contact with the first and second wells 32, 34; more in particular, each one of the first and second inclined walls $S_{i1}$, $S_{i2}$ is in contact with the interface between the first and second wells 32, 34 (designated by I in FIG. 19a), the latter being hence in part delimited laterally by these first and second inclined walls $S_{i1}$, $S_{i2}$.

Figure 19A:
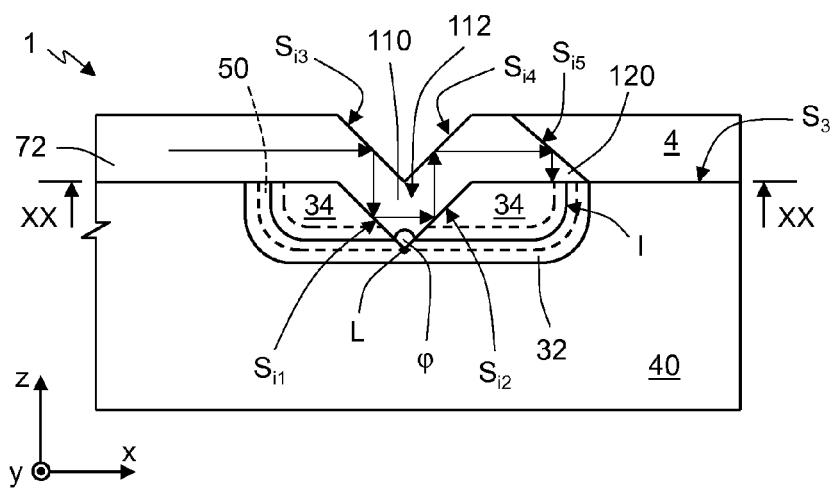
FIG. 19a-19c are schematic illustrations of cross sections of portions of embodiments of the present optoelectronic device.
Figure 20:
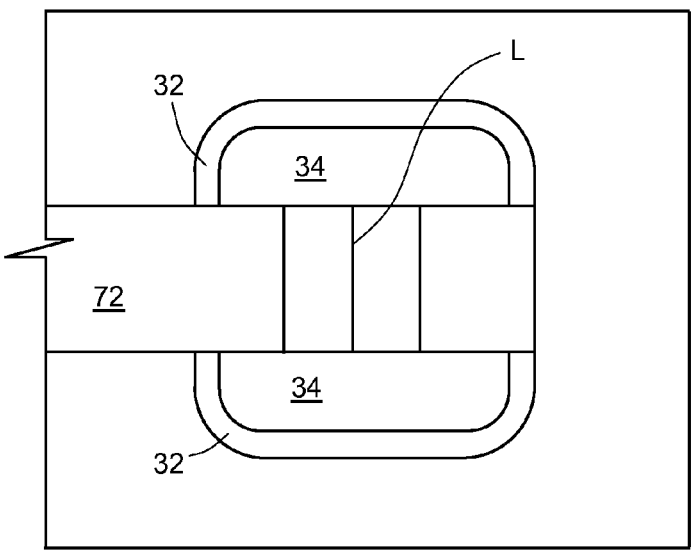

Furthermore, as illustrated once again in FIG. 19a, the contact portion 110 has a constant thickness along the axes x and y. Consequently, in addition to being delimited at the bottom by the first and second inclined walls $S_{i1}$, $S_{i2}$, the contact portion 110 is delimited at the top by a third inclined wall $S_{i3}$ and a fourth inclined wall $S_{i4}$, parallel to the first and second inclined walls $S_{i1}$, $S_{i2}$ respectively. Moreover, the third and fourth inclined walls $S_{i3}$, $S_{i4}$ are at one and the same distance (equal to the thickness of the first transverse channel 72) from the first and second inclined walls $S_{i1}$, $S_{i2}$, respectively. The first channel 72 moreover has one end 120 delimited by a fifth inclined wall $S_{i5}$, which is also of a planar type. In particular, the fifth inclined wall $S_{i5}$ is laterally staggered with respect to the first and second inclined walls $S_{i1}$, $S_{i2}$ and also overlies the depletion region 50; moreover, the fifth inclined wall $S_{i5}$ overlies the intermediate surface $S_3$, with respect to which it is inclined by an angle, for example, equal to 45°.

In use, the optical signal propagates along the first transverse channel 72 until it reaches the contact portion 110 where, on account of reflections at the first and third inclined walls $S_{i1}$, $S_{i3}$, is in part directed in the depletion region 50, with consequent generation of the corresponding electrical signal. Part of the optical signal traverses, however, the contact portion 110, until it reaches the end 120, where it is reflected by the fifth inclined wall $S_{i5}$, once again in the direction of the depletion region 50. In this way, the efficiency of the coupling between the first photodiode 30, in itself of a planar type, and the first transverse channel 72 is increased. Furthermore, in the portions of the depletion region 50, which are arranged in contact with the first and second inclined walls $S_{i1}$, $S_{i2}$, there is an increase in the intensity of the electric field, due precisely to the inclination of the first and second inclined walls $S_{i1}$, $S_{i2}$ with respect to the interface I, the portions of which in contact with the first and second inclined walls $S_{i1}$, $S_{i2}$ are substantially parallel to the intermediate surface $S_3$. Consequently, given a generic instant at which the optical signal penetrates into the depletion region 50, there is a reduction of the delay of the corresponding instant at which the first photodiode 30 generates the corresponding electrical signal; namely, the so-called rapidity of response of the first photodiode 30 increases.

In a variant (not illustrated), on top of the intermediate surface $S_3$ and in a region corresponding to the first and second wells 32 and 34 a coating layer may be present, made, for example, of the same material as the second coating layer 14, and on top of which a portion of the first transverse channel 72 is provided.

In a further variant (not illustrated), an antireflection layer can be arranged on top of the first and second inclined walls $S_{i1}$, $S_{i2}$, i.e., arranged between the second well 34 and the contact portion 110, in order to improve coupling of the optical signal with the first photodiode 30.

Figure 19B:
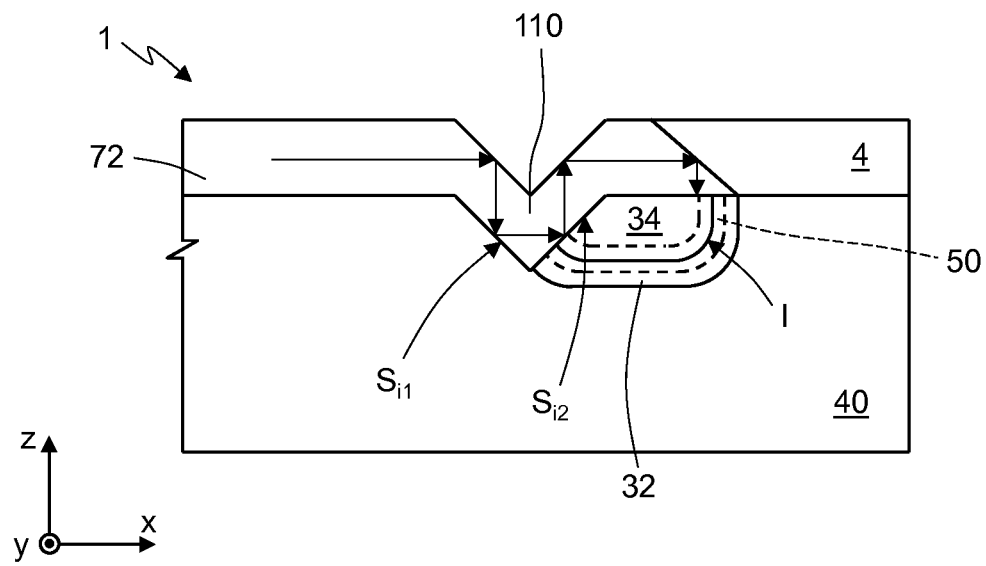
Figure 19C:
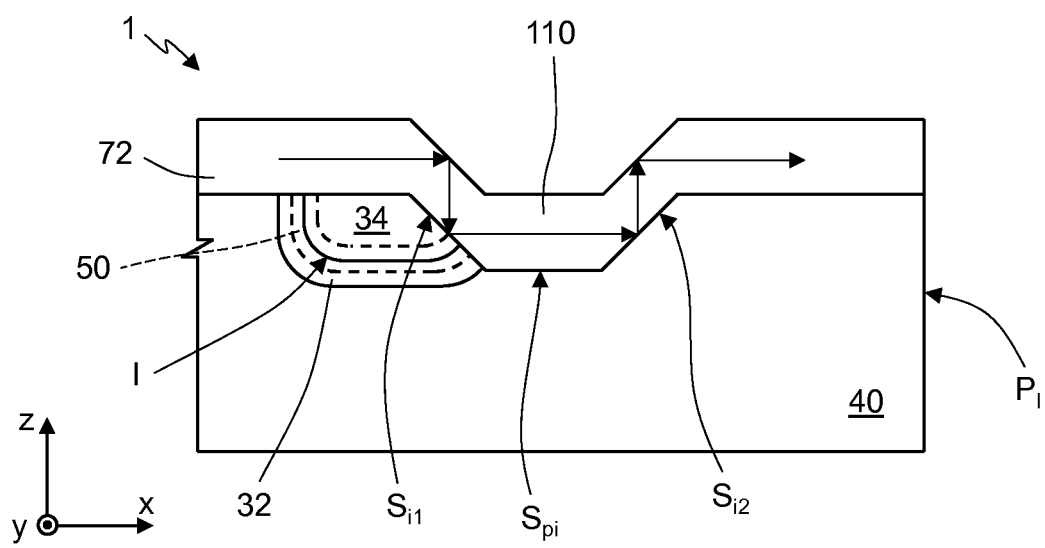

As illustrated in FIG. 19b, it is moreover possible for just one between the first and second inclined walls $S_{i1}$, $S_{i2}$ to be in contact with the depletion region 50. Furthermore, as illustrated in FIG. 19c, the first and second inclined walls $S_{i1}$, $S_{i2}$ can be arranged laterally at a distance from one another, in which case the contact portion 110 is delimited at the bottom not only by the first and second inclined walls $S_{i1}$, $S_{i2}$, but also by a bottom plane wall $S_{pi}$, arranged between the first and second inclined walls $S_{i1}$, $S_{i2}$, with which it is in direct contact, and parallel to the axis x. Once again, the end 120 may be absent, in which case, the first transverse channel 72 extends laterally until it reaches a side wall $P_l$ of the first optoelectronic device 1.

In a variant (not illustrated), on top of the first and second inclined walls $S_{i1}$, $S_{i2}$ there may be set a layer, made, for example, of silicon oxide and having the function of modifying the fraction of optical signal that is effectively transmitted to the first photodiode 30.

Moreover possible are embodiments in which the recess 112 has a shape such that, if sectioned by two different planes parallel to the plane xz, it exhibits a shape of the type illustrated in FIG. 19*a* (without the bottom plane wall $S_{pi}$) and a shape of the type illustrated in FIG. 19*c* (with the bottom plane wall $S_{pi}$) in order to maximize the surface of contact of the first transverse channel 72 with the depletion region 50.

As illustrated in FIG. 21, where for simplicity of illustration the first transverse channel 72 is in direct contact with the semiconductor body 2, moreover possible are embodiments in which more than one photodiode is optically coupled to the first transverse channel 72. In particular, the first optoelectronic device 1 may include a second photodiode 122, arranged at a lateral distance from the first photodiode 30 and optically coupled to the first transverse channel 72. Furthermore, as illustrated by way of example once again in FIG. 21, the optical coupling between the first transverse channel 72 and the first photodiode 30 can be obtained by using a second optical beam splitter 124, formed within the first transverse channel 72 and overlying the first photodiode 30. In the embodiment illustrated in FIG. 21, also the second photodiode 122 is optically coupled to the first transverse channel 72 by using a corresponding optical beam splitter, in the case in point a third optical beam splitter 126. Both the second optical beam splitter 124 and the third optical beam splitter 124, 126 may be, for example, equal to the aforementioned first element 92. The first and second photodiodes 30 and 122 may be either of a planar type or of a vertical type. Furthermore, even though it is not illustrated in FIG. 21, it is possible for the first transverse channel 72 to extend laterally until it reaches the side wall $P_l$ of the first optoelectronic device 1.

According to a different embodiment (illustrated in FIG. 22), the first optoelectronic device 1 includes an emitter 130, such as, for example, a solid-state laser. Furthermore, instead of the through optical via, a first vertical region 132 and a second vertical region 134 are present, with axes parallel to the axis z, but out of line between with respect to one another. According to this embodiment the top surface $S_1$ of the first optoelectronic device 1 is formed by the coating region 75.

In detail, the first and second vertical regions 132, 134 extend, respectively, within the coating region 75 and the semiconductor body 2, respectively, starting from the top surface $S_1$ and from the intermediate surface $S_3$, the second vertical region 134 being coated with the second coating layer 14. The first and second vertical regions 132, 134 are connected to one another by a first portion 141*a* of the first transverse channel (here designated by 140), to which the emitter 130 itself is optically coupled.

More in particular, the emitter 130 and the first and second vertical regions 132, 134 are arranged at a lateral distance from one another, the first vertical region 132 being arranged between the second vertical region 134 and the emitter 130. The emitter 130 is optically coupled to the first vertical region 132 by means of a second portion 141*b* of the first transverse channel 140, which is separated from the first portion 141*a* by the first element 92. In this way, both the first vertical region 132 and the second vertical region 134 are optically coupled to the emitter 130 through the first transverse channel 140.

In greater detail, the second vertical region 134 is optically coupled to the first transverse channel 140, i.e., the optical signal can propagate, in succession, in the second vertical region 134 and then in the first transverse channel 140, thanks to a first reflecting surface $S_m$, formed by the coating region 75 and arranged at a first end of the first portion 141*a* of the first transverse channel 140 so as to overlie the second vertical region 134. The first reflecting surface $S_m$ is of a plane type and is inclined, for example, by 45° with respect to the axis z, i.e., with respect to the axis of the second vertical region 134.

In turn, the first transverse channel 140 is optically coupled to the first vertical region 132 thanks to the first element 92. In particular, the first element 92 is inclined by 45° with respect to the axis of the first vertical region 132, by which it is overlaid; moreover, the first reflecting surface $S_m$ and the first reflecting element 92 are arranged at 90°. The first element 92 hence optically couples the first vertical region 132 and the emitter 130, which may, in a way in itself known, also include within it an optical modulator.

According to a variant (not illustrated), the first reflecting surface $S_m$ is defined, instead of by the coating region 75, by a layer of metal material, such as, for example, an aluminium film, or else by a layer made of a polymeric host material, within which metal particles are dispersed.

Figure 23:
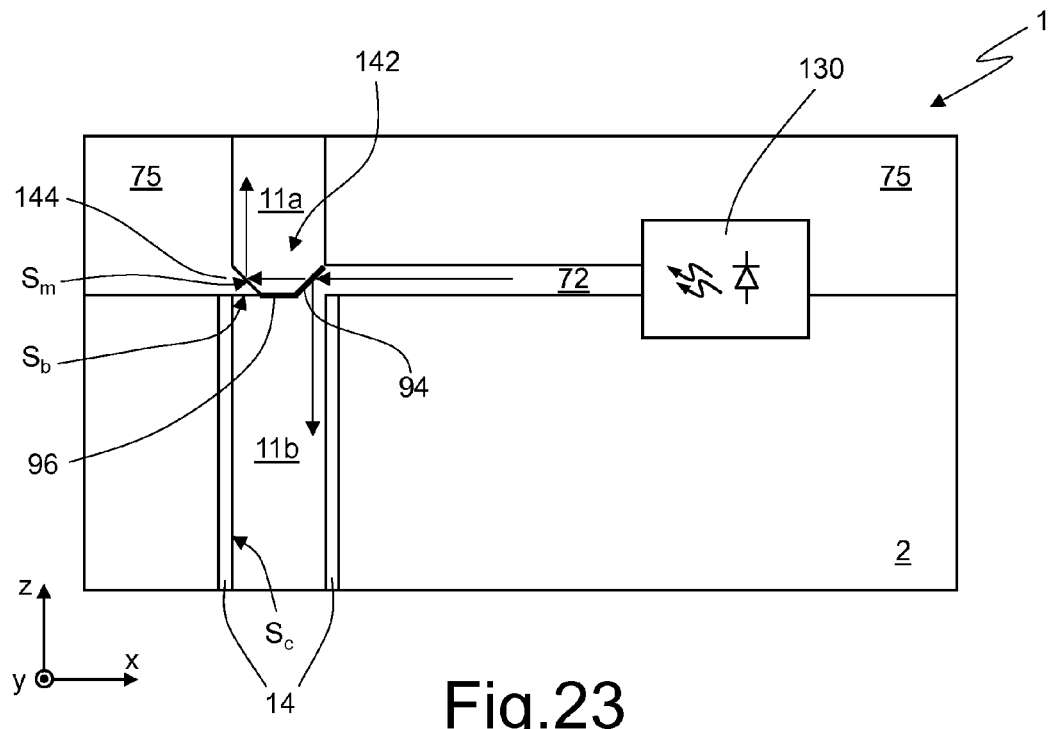

According to one embodiment (illustrated in FIG. 23), the first transverse channel 72 is optically coupled in a bi-directional way to the top portion 11*a* and to the bottom portion 11*b* of the core 10 by using a coupling structure 142 similar to the optical beam splitter illustrated in FIG. 14, but in which, instead of the first element 92, the first reflecting surface $S_m$ is present, which is defined by the coating region 75 and is arranged specularly to the second element 94 with respect to the axis of the core 10. The coupling structure 142 thus formed is overlaid by the top portion 11*a* of the core 10 and overlies the bottom portion 11*b* of the core 10.

In particular, the first reflecting surface $S_m$ is formed by a projection 144 of the coating region 75, which extends laterally within the core 10. The projection 144 is delimited laterally by the first reflecting surface $S_m$. Moreover, the projection 144 is delimited at the bottom by a base surface $S_b$, which departs at 90° from the lateral surface $S_c$ of the core 10. Both the first reflecting surface $S_m$ and the base surface $S_b$ are of a planar type so that the projection 144 has the shape of a prism with a base of a right triangle, with axis parallel to the axis y.

Figure 24:
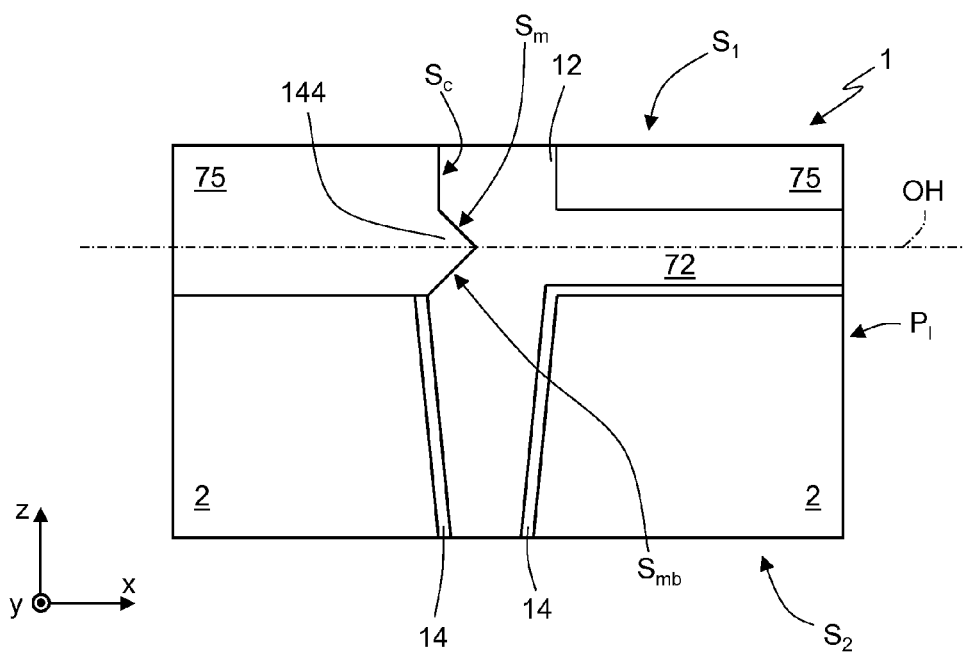

As illustrated in FIG. 24, the projection 144 may be formed not only by the first reflecting surface $S_m$, but also by a second reflecting surface $S_{mb}$; in this case, the second and third elements 94, 96 are absent.

In detail, the second reflecting surface $S_{mb}$ departs also from the lateral surface $S_c$ of the core 10 and forms, with the first reflecting surface $S_m$ an angle, for example, of 90°. In particular, the first and second reflecting surfaces $S_m$, $S_{mb}$ are arranged so that the projection 144 has the shape of a prism with a base of an isosceles triangle, the height of which regarding the side different from the aforementioned first and second reflecting surfaces $S_m$, $S_{mb}$ is parallel to the axis x. More particularly, this height lies substantially along the longitudinal axis of the first transverse channel 72 (designated by OH).

It should be noted that, for practical purposes, the projection 144 functions as optical beam splitter in regard to the optical signal in the case where the latter propagates within the core 10 starting from the top surface $S_1$ or from the bottom surface $S_2$ in the direction of the projection 144 itself, or else in the case where the optical signal propagates within the first transverse channel 72 starting from the side wall $P_l$.

Figure 25:
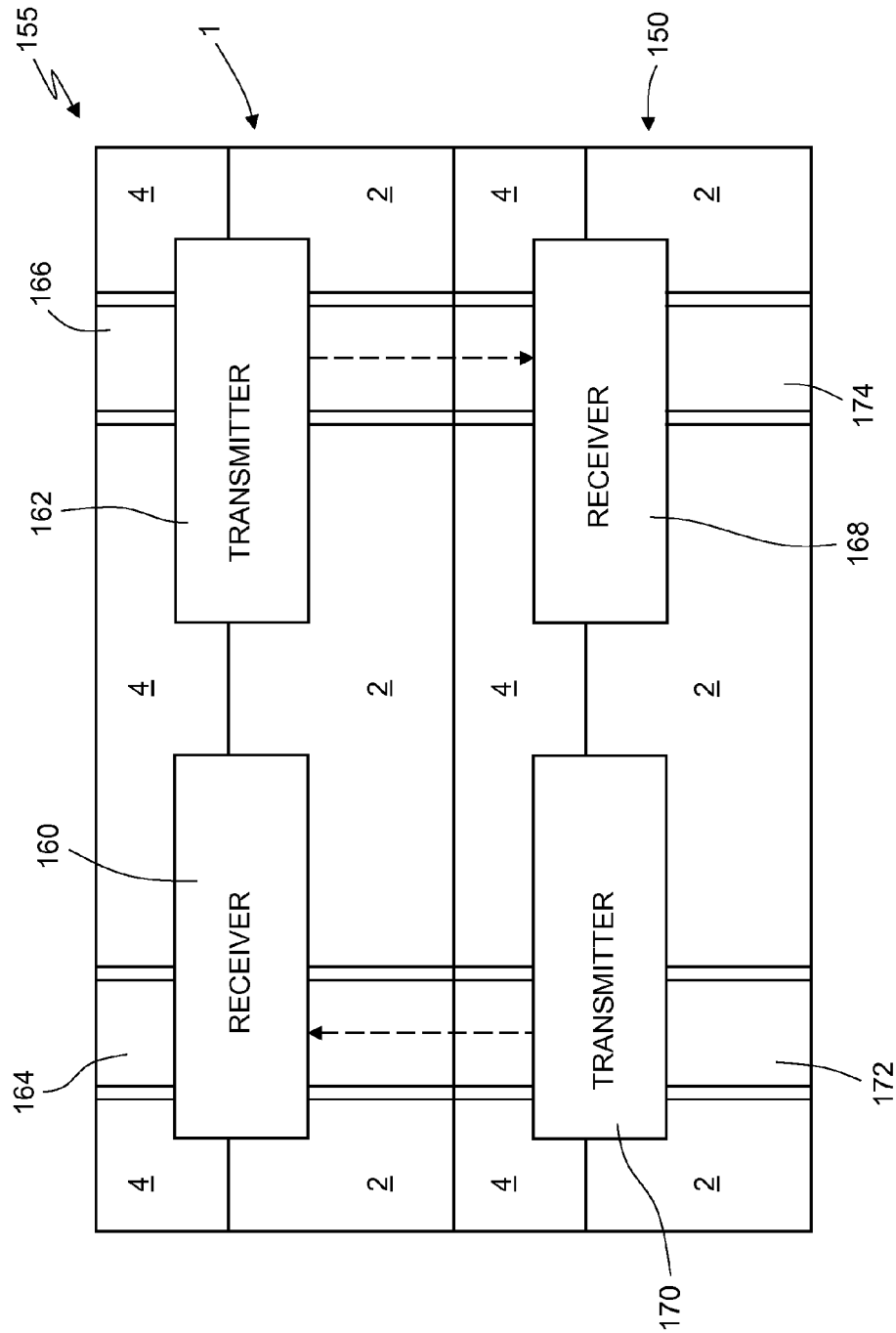
FIG. 25 shows, at the level of principle, a block diagram of an optoelectronic system including two optoelectronic devices.
Figure 26A:
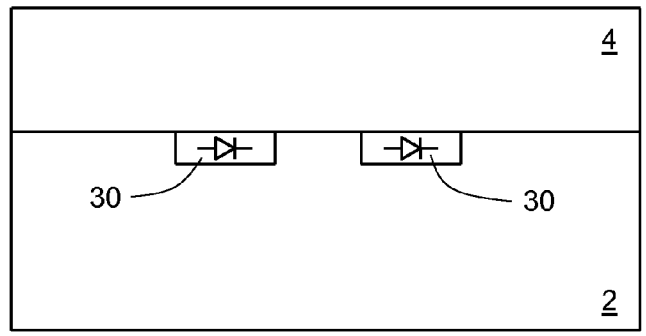
FIG. 26a-26h show cross sections of one and the same embodiment, during successive steps of a manufacturing process.
Figure 26B:
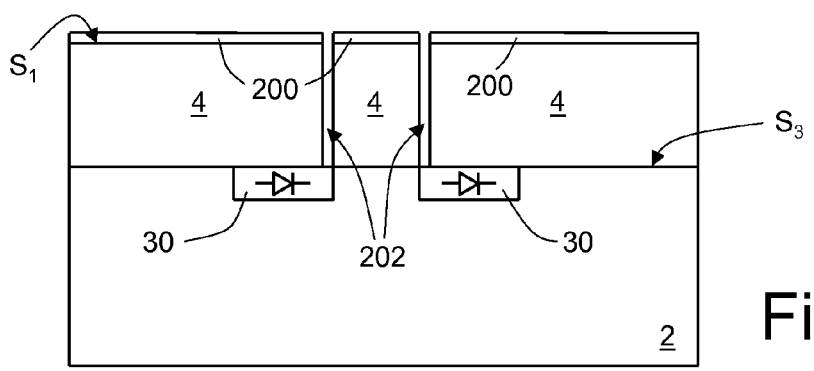
Figure 26C:
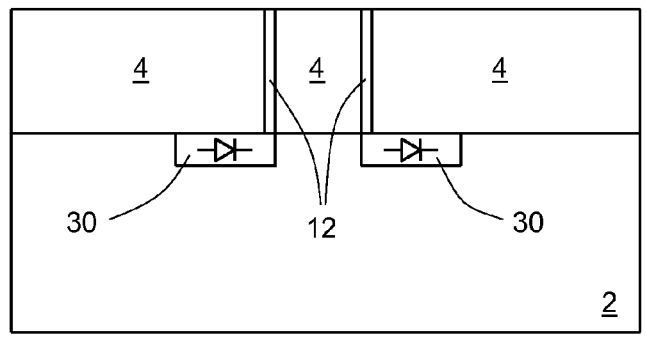
Figure 26D:
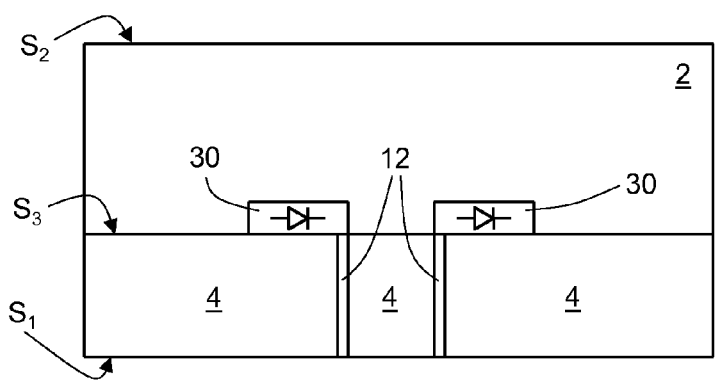
Figure 26E:
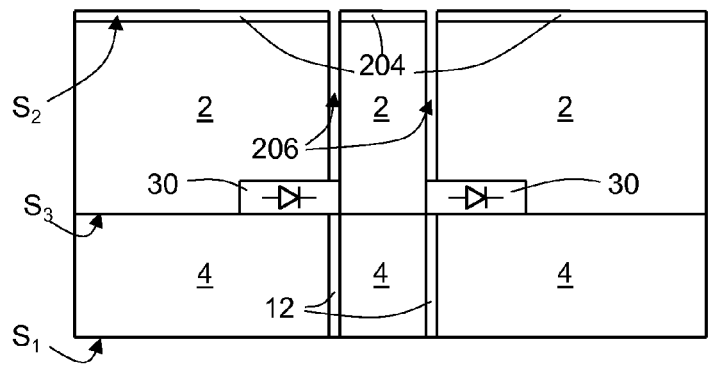
Figure 26F:
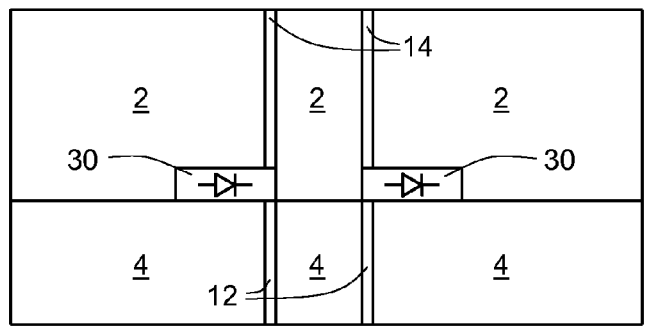
Figure 26G:
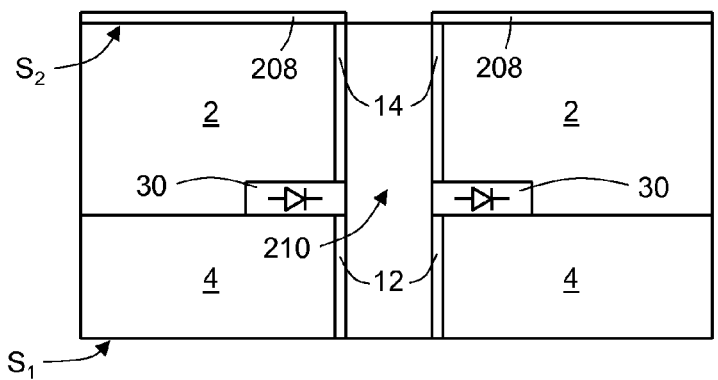
Figure 26H:
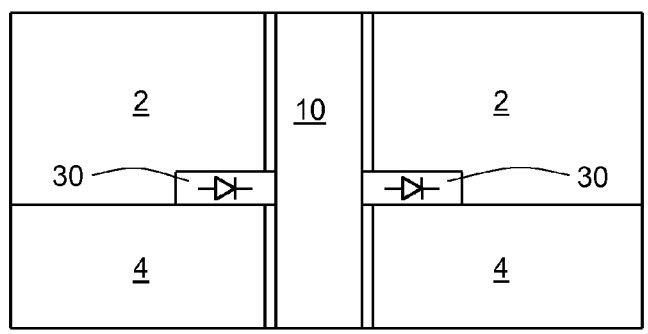

As illustrated in FIG. 25, the first optoelectronic device 1 may be coupled to a second optoelectronic device 150 in order to form an optoelectronic system 155.

The first device 1 comprises, in this case, a first optical receiver 160 and a first optical transmitter 162, where by "optical receiver" is meant a photodetector and a respective electrical control circuit, whereas by "optical transmitter" is meant a light source (for example, a laser source) and a respective electrical driving circuit, possibly provided with functions of modulator. Furthermore, the first optoelectronic device 1 comprises a first optical coupling via 164 and a second optical coupling via 166, each of which is alternatively formed by a through optical via, or else by a corresponding pair of blind vias. The first optical receiver 160 and the first optical transmitter 162 are, respectively, optically coupled to the first and second optical coupling vias 164, 166.

The second optoelectronic device 150 comprises a second optical receiver 168 and a second optical transmitter 170, as well as a third optical coupling via 172 and a fourth optical coupling via 174. The second optical receiver 168 and the second optical transmitter 170 are, respectively, coupled to the third and fourth optical coupling vias 172, 174.

The first and second optoelectronic devices 1, 150 are arranged on top of one another so that the first and third optical coupling vias 164, 172 are aligned and in contact with one another, and the second and fourth optical coupling vias 166, 174 are aligned and in contact with one another. In this way, the optical signals generated by the first optical transmitter 162 are received by the second optical receiver 168, after prior propagation along the second and fourth optical coupling vias 166, 174. Likewise, the optical signals generated by the second optical transmitter 170 are received by the first optical receiver 160, after prior propagation along the first and third optical coupling vias 164, 172. There is hence set up a communication of a bi-directional type between the first and second optoelectronic devices 1, 150.

There are on the other hand possible embodiments in which the first optical receiver 160 and the first optical transmitter 162 are both optically coupled to the first optical coupling via 164, and the second optical receiver 168 and the second optical transmitter 170 are both optically coupled to the third optical coupling via 172. In this case, the second and fourth optical coupling vias 166, 174 are absent. Furthermore, between the first and second optoelectronic devices 1, 150 there can be arranged an external waveguide, directed horizontally, in which case the first and third optical coupling vias 164, 172 may be not aligned to one another.

In the case where the first optical receiver 160 and the first optical transmitter 162 are both optically coupled to the first optical coupling via 164, they are coupled, respectively, to the first and second transverse channels, which are oriented so as to form an angle of, for example, 90° so that the electromagnetic radiation produced by the first optical transmitter 162 couples to the first coupling via 164 without being received by the first optical receiver 160.

In one embodiment (not illustrated), alongside the first and second optoelectronic devices 1, 150 there may be present a third optoelectronic device and a fourth optoelectronic device, which optically couple in the horizontal direction through respective transverse channels, which extend laterally until they reach the respective side walls.

Described in what follows are methods for manufacturing some of the embodiments described previously, purely by way of example.

For example, to manufacture the embodiment illustrated in FIG. 2, the operations illustrated in FIG. 26a-26h are performed.

In detail (FIG. 26a), the semiconductor body 2, formed inside which is the first photodiode 30, and the top region 4 are provided.

Next (FIG. 26b), a first photolithographic process is carried out by application of a first resist mask 200 on the top surface $S_1$, and subsequent anisotropic etching of the top region 4 in order to form a first trench 202, which extends from the top surface $S_1$ up to the intermediate surface $S_3$, and has the shape, in top plan view, of an annulus.

Next (FIG. 26c), the first resist mask 200 is removed, and a first process of chemical vapour deposition (CVD) is carried out in order to form the first coating layer 12 within the first trench 202.

Then (FIG. 26d), the first optoelectronic device 1 is turned over, and a process of back-grinding of the semiconductor body 2 is carried out in order to reduce the thickness of the latter in a range, for example, between 50 μm and 150 μm.

Next (FIG. 26e), a second photolithographic process is carried out by means of application of a second resist mask 204 to the bottom surface $S_2$ and subsequent anisotropic etching of the semiconductor body 2 in order to form a second trench 206 having the same shape, in top plan view, as the first trench 202, to which it is vertically aligned. The second trench 206 extends from the bottom surface $S_2$ until it reaches a distance, equal to the thickness h, from the intermediate surface $S_3$. In particular, the anisotropic etching may be carried out by means of the so-called deep reactive ion etching (DRIE) process.

Then (FIG. 26f), the second resist mask 204 is removed, and a second process of chemical vapour deposition is carried out in order to form the second coating layer 14, within the second trench 206. Alternatively, it is possible to carry out a process of thermal oxidation.

Next (FIG. 26g), a third photolithographic process is carried out by means of application of a third resist mask 208 to the bottom surface $S_2$ and subsequent anisotropic etching of the semiconductor body 2 and of the top region 4 in order to form a first hole 210 having, for example, a cylindrical shape, which extends between the bottom surface $S_2$ and the top surface $S_1$ and is surrounded directly by the first and second coating layers 12, 14. The first hole 210 is hence a through hole, and the anisotropic etch that leads to formation thereof may, for example, be a DRIE. It is moreover possible for this anisotropic etching to be carried out by applying the third resist mask 208 to the top surface $S_1$, instead of to the bottom surface $S_2$. Alternatively, the first hole 210 may be formed by a laser-drilling process, which does not require the use of masks.

Then (FIG. 26h), the third resist mask 208 is removed, and a third process of chemical vapour deposition is carried out in order to form the core 10, within the first hole 210. Alternatively, it is possible to fill the first hole 210 with a polymer by means of a process of spinning and subsequently carry out curing of the polymer.

In order to manufacture an embodiment of the type illustrated in FIG. 13, in which, however, the first and second transverse channels 72, 74 are not tapered, it is possible to carry out the operations illustrated in FIG. 27a-27l.

Figure 27A:
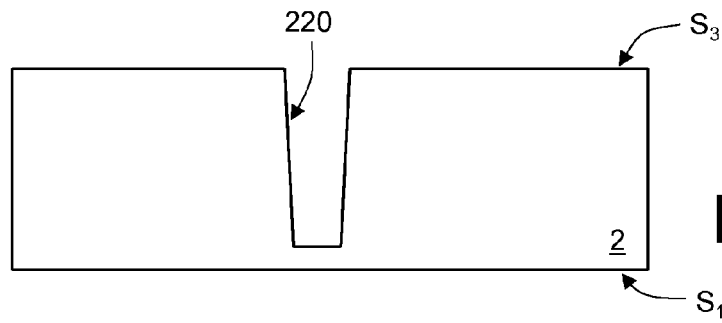
Figure 27B:
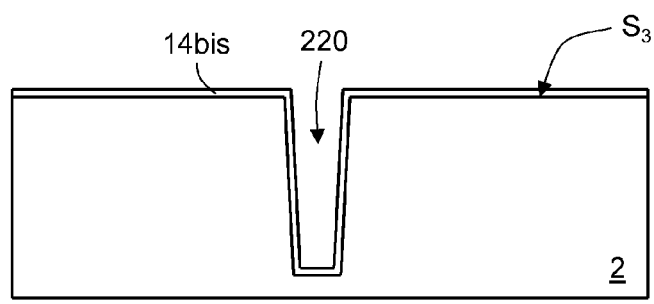
Figure 27C:
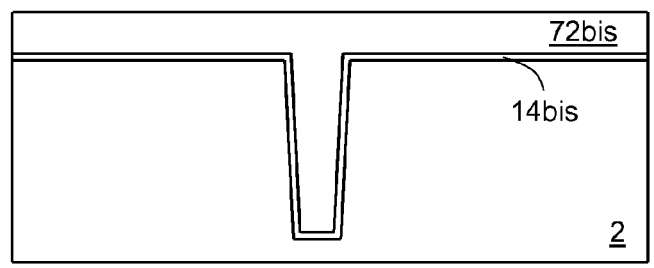
Figure 27D:
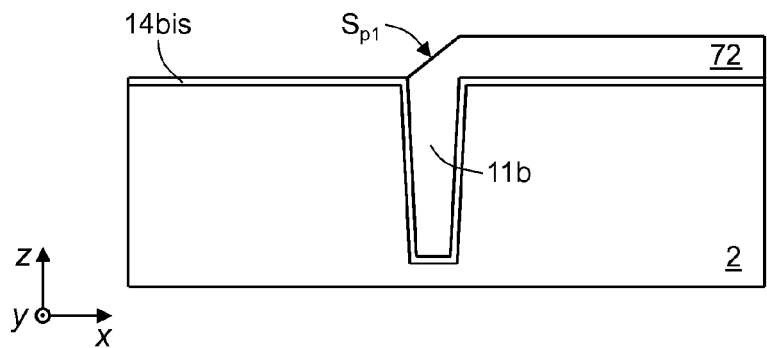
Figure 27E:
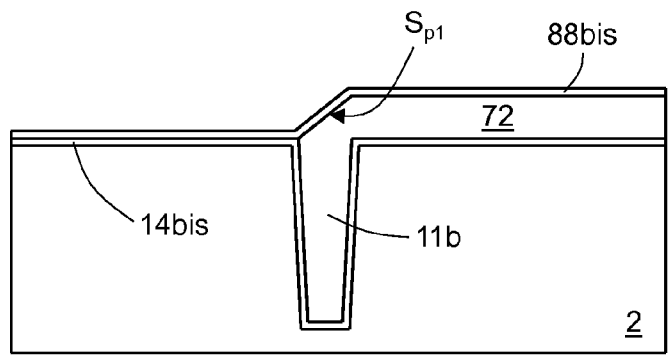
Figure 27F:
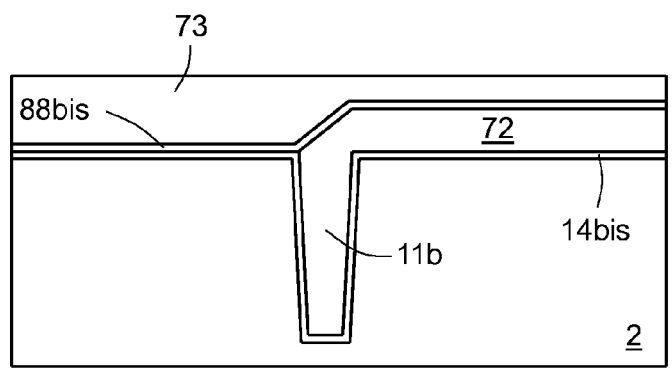
Figure 27G:
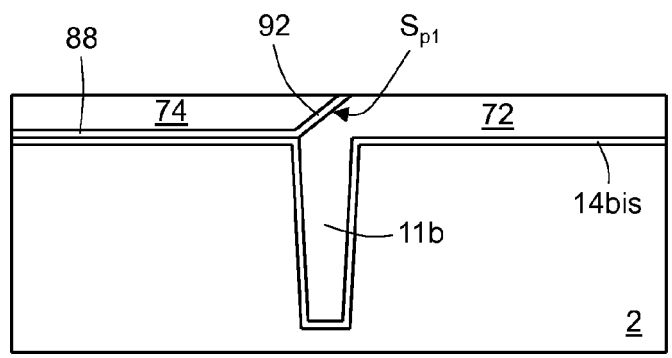
Figure 27H:
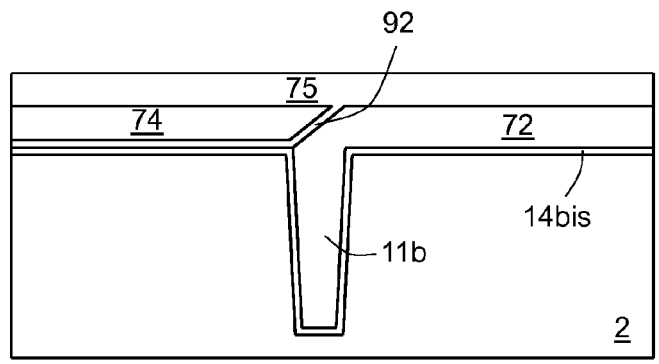
Figure 27I:
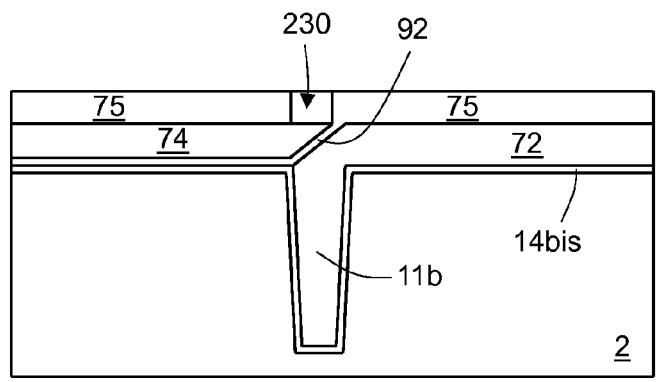
Figure 27L:
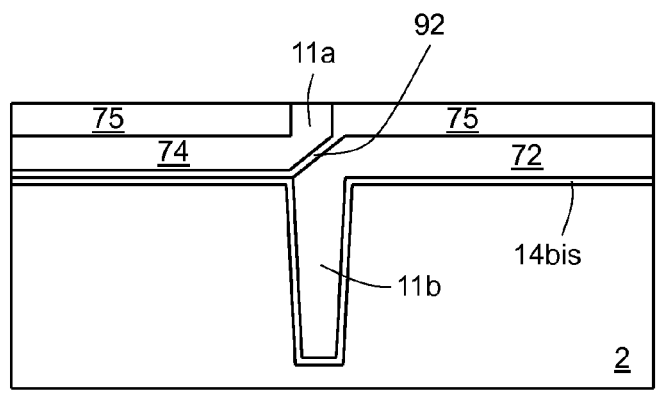
Figure 28A:
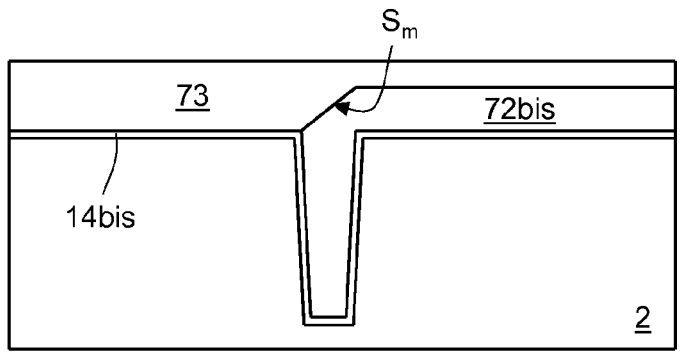
FIG. 28a-28h show cross sections of one and the same embodiment, during successive steps of a manufacturing process.
Figure 28B:
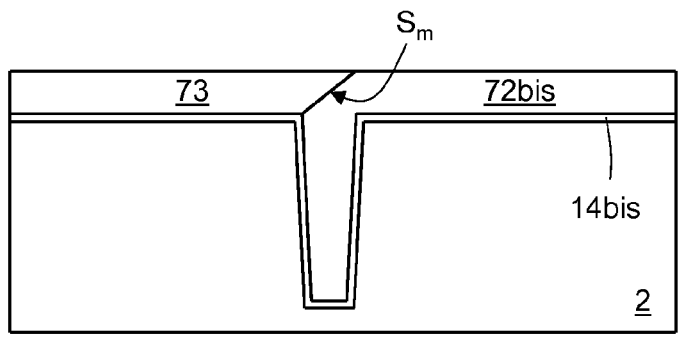
Figure 28C:
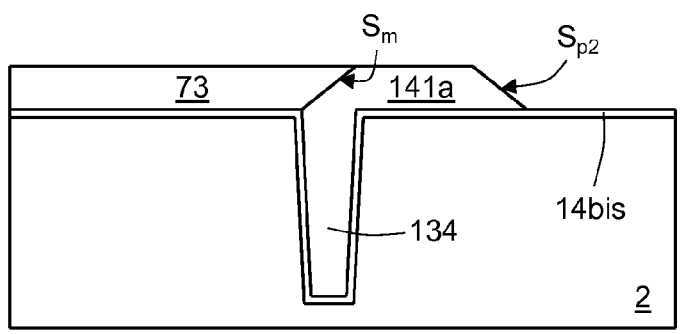
Figure 28D:
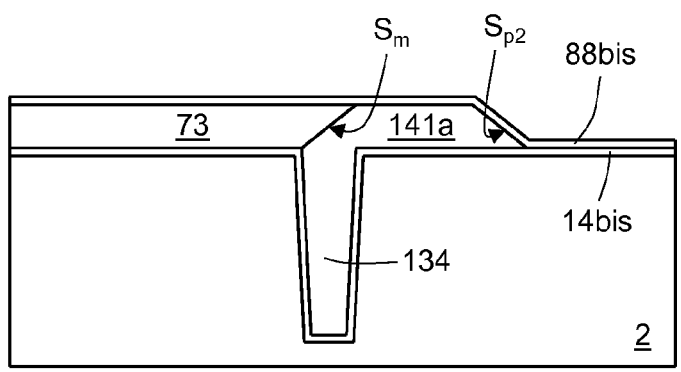
Figure 28E:
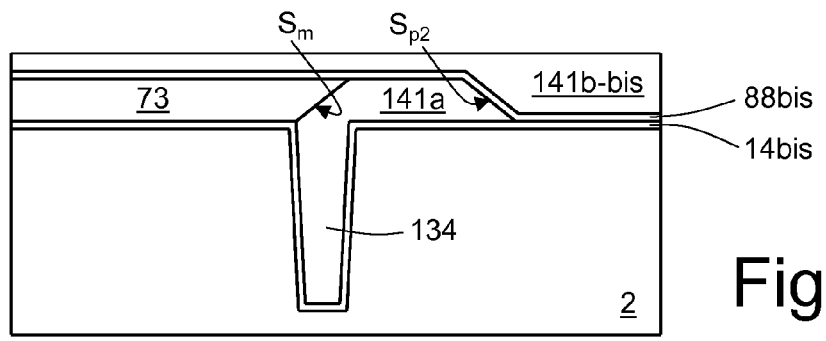
Figure 28F:
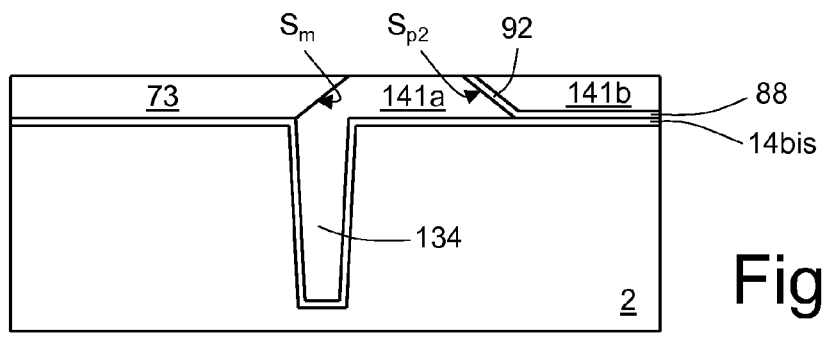
Figure 28G:
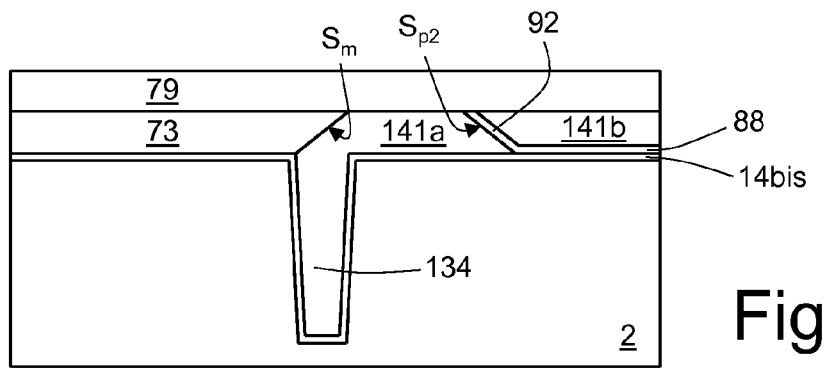
Figure 28H:
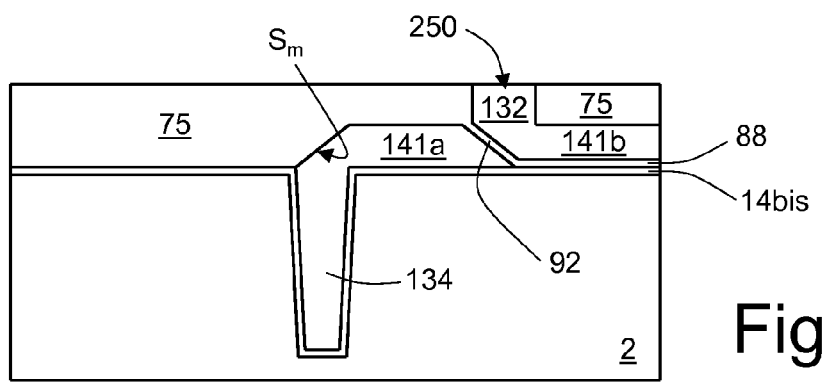

As illustrated in FIG. 27a, the semiconductor body 2 is provided, formed inside which is the first photodiode 30 (not illustrated in FIG. 27a-27h). Furthermore, a first anisotropic etch of the semiconductor body 2 is carried out, starting from the intermediate surface $S_3$ in order to form the first hole, which is here designated by 220 and which extends into the semiconductor body 2; the first hole 220 is of a blind type. For this purpose, it is possible to carry out a DRIE.

Next (FIG. 27b), a first chemical vapour deposition is carried out in order to form a first preliminary layer 14bis, which coats the intermediate surface $S_3$ and coats the side walls and the bottom of the first hole 220, without filling it completely; alternatively, a process of thermal oxidation is performed.

Then (FIG. 27c), a second chemical vapour deposition is carried out in order to form a first process region 72bis on top of the first preliminary layer 14bis, which hence overlies the entire intermediate surface $S_3$ and completely fills the first hole 220, where it is surrounded by the first preliminary layer 14bis.

Next (FIG. 27d), a second anisotropic etch is carried out in order to remove selectively a portion of the first process region 72bis, the remaining portion of the second process region 72bis forming the first transverse channel 72, as well as the bottom portion 11b of the core 10. This anisotropic etch moreover causes formation of a first process surface $S_{P1}$, inclined both with respect to the axis of the bottom portion 11 of the core 10 and with respect to the axis of the first transverse channel 72, i.e., inclined (for example, by 45°) with respect to the axes z and x. The first process surface $S_{P1}$ is of a planar type, has a rectangular shape and is formed by the same first transverse channel 72; moreover, the first process surface $S_{P1}$ is arranged on top of the bottom portion 11b of the core 10.

Next (FIG. 27e), a third chemical vapour deposition is performed in order to form a second preliminary layer 88bis, which extends over the first transverse channel 72 and part of the first preliminary layer 14bis. Consequently, the second preliminary layer 88bis extends also over the first process surface $S_{P1}$, with which it is in direct contact.

Then (FIG. 27f), a fourth chemical vapour deposition is carried out in order to form a second process region 73, which is arranged on top of the second preliminary layer 88bis and is to form the second transverse channel 74.

Next (FIG. 27g), a first operation of chemical mechanical polishing (CMP) is carried out in order to remove a top portion of the second process region 73 until the first transverse channel 72 is once again exposed. The portion of second process region 73 that has remained after this first chemical mechanical polishing forms the second traverse channel 74. During this polishing, a portion of the second preliminary layer 88bis is moreover removed, the remaining portion of the second preliminary layer 88bis forming the third coating layer 88 and the aforementioned first element 92, i.e., the first optical beam splitter.

Next (FIG. 27h), a fifth chemical vapour deposition is carried out in order to form the coating region 75 on top of the first and second transverse channels 72, 74.

Then (FIG. 27i), a third anisotropic etch is carried out in order to form a second hole 230. The second hole 230 is of a blind type and is delimited at the bottom by the second transverse channel 74. Moreover, the second hole 230 is vertically aligned to the bottom portion 11b of the core 10 and overlies the first element 92.

Next (FIG. 27l), a sixth chemical vapour deposition is carried out in order to form, within the second hole 230, the top portion 11a of the core 10. Finally, an operation of chemical mechanical polishing of the bottom portion of the semiconductor body 2 is carried out (step not illustrated) until the bottom portion 11b of the core is exposed, removing a corresponding portion of the first preliminary layer 14bis; the remaining portion of the first preliminary layer 14bis thus defines the second coating layer 14.

Figure 22:
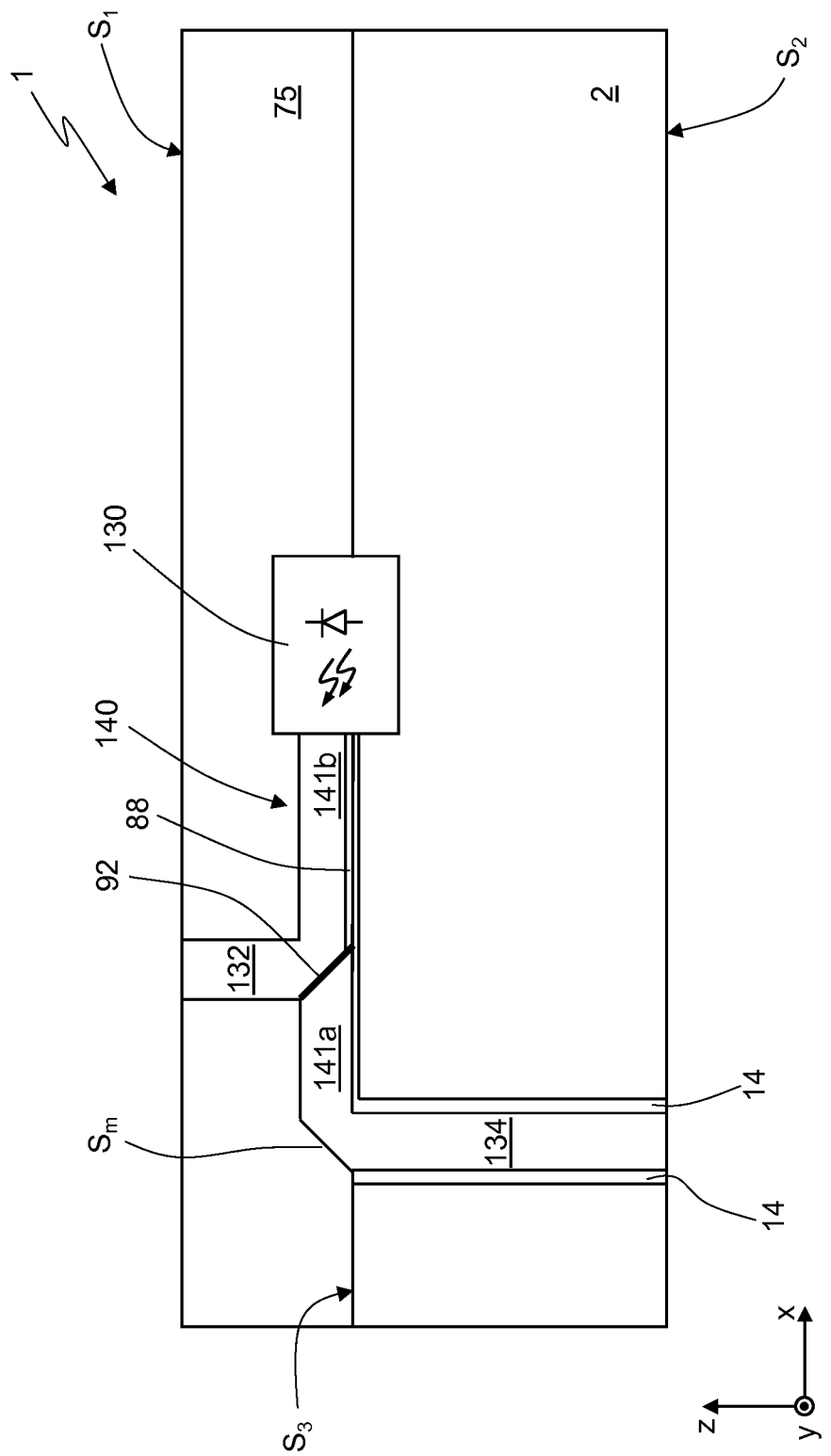

With regard to the embodiment illustrated in FIG. 22, and assuming for simplicity of description that the emitter 130 is absent, it is, instead, possible to carry out the operations illustrated in FIG. 27a-27d, where the aforementioned first process surface $S_{P1}$ functions as first reflecting surface $S_m$. Then, the operations illustrated in FIG. 28a-28h are performed.

In detail (FIG. 28a), a third chemical vapour deposition is carried out in order to form, on top of the first process region 72bis, the second process region 73, which also overlies the first preliminary layer 14bis, with which it is in part in direct contact.

Next (FIG. 28b), a first chemical mechanical polishing is carried out in order to remove a top portion of the second process region 73 until part of the first process region 72bis is once again exposed.

Then (FIG. 28c), a third anisotropic etch is made in order to remove selectively a part of the first process region 72bis, arranged laterally and at a distance from the first reflecting surface $S_m$. In particular, the removal is such as to expose a corresponding portion of the first preliminary layer 14bis. The remaining portion of the first process region 72bis forms the first portion 141a of the first transverse channel 140 in addition to the second vertical region 134.

In particular, the first portion 141a is delimited laterally by a second process surface $S_{P2}$, which is of a planar type, has a rectangular shape, and is arranged at a lateral distance from the first reflecting surface $S_m$. More in particular, the second process surface $S_{P2}$ is inclined with respect to the axis z, with respect to the axis of the first transverse channel 140 (parallel to the axis x), and with respect to the first reflecting surface $S_m$. For example, the second process surface $S_{P2}$ is inclined by 45° with respect to the axes x and z and by 90° with respect to the first reflecting surface $S_m$.

Next (FIG. 28d), a fourth chemical vapour deposition is carried out in order to form the second preliminary layer 88bis on top of the first process region 73, the first portion 141a of the first transverse channel 140, and the exposed portion of the first preliminary layer 14bis.

Then (FIG. 28e), a fifth chemical vapour deposition is carried out in order to form a third process region 141b-bis on top of the second preliminary layer 88bis.

Next (FIG. 28f), a second chemical mechanical polishing of the third process region 141b-bis is carried out until the first portion 141a of the first transverse channel 140 is once again exposed. In practice, during this second polishing, a part of the third process region 141b-bis and a part of the second preliminary layer 88bis are removed, the latter part being previously arranged on top of the second process region 73 and of the first portion 141a of the first transverse channel 140. The remaining portion of the third process region 141b-bis defines the second portion 141b of the first transverse channel 140. A first remaining portion of the second preliminary layer 88bis, arranged on top of the second process surface $S_{P2}$, forms, instead, the aforementioned first element 92; i.e., it will function, in use, as optical beam splitter. A second remaining portion of the second preliminary layer 88bis, arranged in contact with the first preliminary layer 14bis, forms the third coating layer 88.

Then (FIG. 28g), a sixth chemical vapour deposition is carried out in order to form a fourth process region 79, which forms, together with the second process region 73, the coating region 75.

Next (FIG. 28h), a fourth anisotropic etch is carried out in order to form the second hole, here designated by 250. The second hole 250 is of a blind type, is vertically aligned to the first element 92, and is delimited at the bottom by the second portion 141*b* of the first transverse channel 140. There is then carried out a seventh chemical vapour deposition, in order to form, within the second hole 250, the first vertical region 132. Finally (step not illustrated), an operation of chemical mechanical polishing of the bottom surface is carried out until the second vertical region 134 is exposed.

The advantages that embodiments of the present optoelectronic devices afford emerge clearly from the foregoing description. In particular, the present optoelectronic devices enable three-dimensional (3D) systems to be obtained, where two or more integrated optoelectronic devices are arranged on top of one another and are able to communicate optically with one another. Furthermore, by adopting one of the embodiments with at least one transverse channel that extends as far as the side wall of the optoelectronic device, it is possible to form a system comprising two or more optoelectronic devices arranged alongside one another and with the respective transverse channels aligned in order to enable communication between them.

In addition, since the first photodiode 30 and/or the emitter 130 are formed in the semiconductor body 2, they are precisely made of the same semiconductor as that of the semiconductor body 2, without the need to envisage steps of bonding to the semiconductor body 2 of a further body made of a different semiconductor material. Once again, the present optoelectronic device is of an integrated type, and hence can be manufactured by using just technologies of a microelectronic type, consequently without any need to resort to operations such as, for example, bonding.

Finally, it is clear that modifications and variations may be made with respect to what has been described and illustrated herein, without thereby departing from the sphere of protection of the present disclosure, as defined in the annexed claims.

For example, the first photodiode 30 may be of the so-called PIN, instead of PN, type; moreover, instead of the first photodiode 30, there may be present an optical emitter, such as, for example, a LED or a laser. In general, moreover, reference is made to an optoelectronic component integrated in the semiconductor body 2 to indicate any optoelectronic component, the active region of which is formed in the semiconductor body 2. This active region may, for example, include, in a way in itself known, a PN junction, or else, in the case of an optical emitter, the region in which there arises the phenomenon of stimulated emission or spontaneous emission. Furthermore, the optoelectronic component integrated in the semiconductor body may, for example, be a photoconductor, a photoresistor, or a phototransistor.

The first and second coating layers 12, 14 may be made of materials different from one another.

With regard to the transverse channels, embodiments are possible in which only the first transverse channel 72 is present. Furthermore, the geometrical shapes described in regard to the first and second transverse channels 72, 74, as well as in connection with the core 10 are proposed purely by way of example. For instance, it is possible for one or both of the portions, i.e., the top portion 11*a* and the bottom portion 11*b* of the core 10, to have a frustoconical or frustopyramidal shape. Furthermore, both the first and second transverse channels may have different shapes; for example, they may be strip-shaped or else have a so-called "rib waveguide" shape.

Likewise, also the shapes of the first and second vertical regions 132, 134 may be different from what has been described.

In addition, also the first and second inclined walls $S_{i1}$, $S_{i2}$ may have shapes different from what has been described and illustrated; for example, they may be trapezoidal in shape.

In other embodiments, optoelectronic devices and interconnection or waveguide structures according to the above described embodiments or other embodiments are contained within an integrated circuit, such as an image sensor or image scanning device. Moreover, such an integrated circuit may be contained in an electronic system, such as a smartphone, digital camera, computer system, printer, or scanner, for example. The electronic system may, for example, include a first integrated circuit such as an image sensor coupled to a second integrated circuit like a processor, where the image sensor and processor may be formed on the same semiconductor die or on different semiconductor dies. These die and the optoelectronic components formed therein may be interconnected in planar and three-dimensional manner as discussed above, and the same is true of components formed within a given semiconductor die.

Finally, embodiments are possible that are hybrid with respect to the embodiments described and/or illustrated, where technical characteristics of two or more of the embodiments described and/or illustrated are present.

The invention claimed is:

1. An integrated optoelectronic device, delimited by a first surface and a second surface and comprising:
  a body of semiconductor material including at least one optoelectronic component integrally formed in the body of semiconductor material, the at least one optoelectronic component being a detector or an emitter; and
  an optical path integrally formed in the body of semiconductor material, the optical path at least in part of a guided type and extends between the first surface and the second surface, said optical path traversing the body of semiconductor material; and
  wherein the at least one optoelectronic component is optically coupled through the optical path and the first surface to free space and through the optical path and the second surface to free space.

2. The device according to claim 1, further comprising a top region, arranged on top of the body and forming the first surface, the body being delimited by the second surface and by a main surface, the main surface being arranged between the first and second surfaces; and wherein the optical path is formed by a first confinement region and a second confinement region, the first confinement region extending within the top region, starting from the first surface, the second confinement region extending within the body, starting from the second surface; and wherein the first confinement region is surrounded laterally by a first lateral region, which has a refractive index less than the refractive index of the first confinement region so that the first confinement region and the first lateral region form a first coupling waveguide; and wherein the second confinement region is surrounded laterally by a second lateral region, which has a refractive index less than the refractive index of the second confinement region so that the second confinement region and the second lateral region form a second coupling waveguide.

3. The device according to claim 2, further comprising a first coating layer, which surrounds laterally the first confinement region and forms the first lateral region.

4. The device according to claim 2, further comprising a second coating layer, which surrounds laterally the second confinement region and forms the second lateral region.

5. The device according to claim 2, comprising a hole, which extends between the first surface and the second surface, the first and second confinement regions being arranged within the hole.

6. The device according to claim 5, comprising a core, which is arranged within the hole and forms the first and second confinement regions.

7. The device according to claim 6, wherein the first and second confinement regions are arranged on top of one another; and wherein the first and second lateral regions are arranged on top of one another and are separate from one another so that the core comprises a non-coated region, arranged between the first and second confinement regions; and wherein the optoelectronic component is optically coupled to said non-coated region.

8. The device according to claim 7, wherein the optoelectronic component is formed from a first region and a second region of semiconductor material, which have different types of conductivity and are separated by an interface surface, which is in direct contact with the non-coated region of the core.

9. The device according to claim 2, wherein the first and second confinement regions are arranged on top of one another; and wherein the at least one optoelectronic component is arranged between the first and second confinement regions.

10. The device according to claim 6, further comprising a first transverse channel, which extends transverse to the core, with which it is in direct contact, and is surrounded at the top and at the bottom by a third lateral region, which has a refractive index less than the refractive index of the first transverse channel so that the first transverse channel and the third lateral region form a first transverse waveguide, said first transverse waveguide being optically coupled to the first and second coupling waveguides.

11. The device according to claim 10, further comprising an optical beam splitter designed to couple the first transverse waveguide optically to the first and second coupling waveguides.

12. The device according to claim 11, wherein the first and second coupling waveguides extend parallel to a first direction, and wherein the first transverse waveguide extends parallel to a second direction; and wherein the optical beam splitter comprises a first layered element, which is arranged within the hole, transverse to the first and second directions, and has a refractive index less than the refractive index of the core.

13. The device according to claim 12, further comprising a second transverse channel, which extends transverse to the core and is surrounded at the top and at the bottom by a fourth lateral region, the refractive index of the second transverse channel being greater than the refractive index of the fourth lateral region so that the second transverse channel and the fourth lateral region form a second transverse waveguide.

14. The device according to claim 13, wherein the first layered element separates the first confinement region from the second confinement region, and the first transverse channel from the second transverse channel, said first layered element being moreover designed so as to couple an optical signal alternatively to the first transverse waveguide, if the optical signal propagates in the first coupling waveguide starting from the first surface, or else to the second transverse waveguide, if the optical signal propagates in the second coupling waveguide starting from the second surface.

15. The device according to claim 13, wherein the second transverse waveguide extends parallel to the second direction, and wherein the optical beam splitter comprises a second layered element, arranged specular to the first element, with respect to an axis parallel to the first direction.

16. The device according to claim 15, wherein the optical beam splitter further comprises a third layered element and a fourth layered element, which are arranged, respectively, specular to the first and second layered elements, with respect to an axis parallel to the second direction, the optical beam splitter being designed to couple an optical signal both to the first and to the second transverse waveguides, if the optical signal propagates in the first coupling waveguide starting from the first surface or else propagates in the second coupling waveguide starting from the second surface.

17. The device according to claim 12, wherein the first and second directions are orthogonal to one another and said first layered element forms an angle substantially equal to 45° both with respect to the first direction and with respect to the second direction.

18. The device according to claim 10, further comprising a coupling structure designed to couple an optical signal that propagates along the first transverse waveguide and in the direction of the core with the first and second coupling waveguides, said coupling structure comprising at least one reflecting surface.

19. The device according to claim 10, wherein the first transverse channel extends on top of the main surface of the body and underneath said first surface.

20. The device according to claim 19, wherein the body forms a recess, which extends from the main surface and is delimited at least by a first wall, arranged transverse to the main surface; and wherein the first transverse channel extends at least in part within the recess; and wherein the optoelectronic component is formed by a first region and a second region that form a junction, said junction facing the first wall.

21. The device according to claim 20, wherein the recess is moreover delimited by a second wall, which is transverse with respect to the main surface and to the first wall, said junction moreover facing the second wall.

22. The device according to claim 20, wherein a portion of the first transverse channel arranged on top of the first wall is delimited at the top by a further wall, which is parallel to the first wall.

23. An optoelectronic system comprising at least a first optoelectronic device according to claim 1, said first optoelectronic device comprising an optical emitter; said optoelectronic system further comprising a second optoelectronic device, which comprises an optical detector, said optical emitter and said optical detector being optically coupled through the optical path of the first optoelectronic device.

24. A process for manufacturing an optoelectronic device delimited by a first surface and by a second surface, the process comprising:
forming a body of semiconductor material having integrally formed inside at least one optoelectronic component chosen between a detector and an emitter; and
forming integrally in the body of semiconductor material an optical path, which is at least in part of a guided type and extends between the first surface and the second surface, said optical path traversing the body of semiconductor material;
and wherein forming an optical path comprises forming the optical path so that the at least one optoelectronic component is optically coupled, through said optical path, to a first portion of free space and a second portion of free space, which are arranged, respectively, above and underneath the first and second surfaces.

25. The manufacturing process according to claim 24, wherein the body is delimited by the second surface and by a main surface, and further comprising the step of forming on top of the body a top region forming the first surface so that the main surface is arranged between the first and second surfaces; and wherein the step of forming the optical path comprises:

forming, starting from the first surface, a first confinement region, which extends into the top region;

forming, starting from the second surface, a second confinement region, which extends into the body;

forming, around the first confinement region, a first lateral region, which has a refractive index less than the refractive index of the first confinement region; and forming, around the second confinement region, a second lateral region, which has a refractive index less than the refractive index of the second confinement region.

26. The process according to claim 25, wherein said steps of forming a first confinement region and a second confinement region and a first lateral region and a second lateral region comprise:

forming a first trench within the top region;

forming the first lateral region within the first trench;

forming a second trench within the body;

forming the second lateral region within the second trench;

selectively removing portions of the top region and of the body surrounded, respectively, by the first lateral region and by the second lateral region, thereby forming a hole, which extends between the first surface and the second surface and is delimited by the first and second lateral regions; and forming the first and second confinement regions within the hole.

27. The process according to claim 25, further comprising the steps of:

forming a first hole within the body in a first direction;

forming a first preliminary layer, which extends on top of the body, coats the walls of the first hole, and forms the second lateral region;

forming a first preliminary region on top of the first preliminary layer, a portion of the first preliminary region extending within the first hole and forming the second confinement region;

selectively removing a portion of the first preliminary region, the remaining portion of the first preliminary region being delimited by a process surface, arranged on top of the second confinement region and transverse with respect to the first direction;

forming, on top of the process surface, a second preliminary layer forming, on top of the second preliminary layer, a second preliminary region;

removing a portion of the second preliminary region until said remaining portion of the first preliminary region is exposed, which is separated from the remaining portion of the second preliminary region by a portion of the second preliminary layer;

forming the first lateral region on top of said remaining portions of the first and second preliminary regions and so that it will form a second hole; and forming the first confinement region within the second hole.

28. An optoelectronic device, comprising:

an optoelectronic component integrally formed in a body of semiconductor material, the body including a first surface that interfaces with a first region of space surrounding the body and a second surface that interfaces with a second region of space surrounding the body; and an optical path integrally formed in the body and extending between the first surface and the second surface, the optical path being coupled to the optoelectronic component and being operable to couple electromagnetic energy from the first and second regions of space to the optoelectronic component.

* * * * *